US011244995B2

(12) United States Patent
Cho et al.

(10) Patent No.: US 11,244,995 B2
(45) Date of Patent: Feb. 8, 2022

(54) ELECTRONIC DEVICE AND ILLUMINANCE SENSING METHOD BASED ON DISPLAY INFORMATION ON ELECTRONIC DEVICE

(71) Applicant: Samsung Electronics Co., Ltd., Suwon-si (KR)

(72) Inventors: Jeongho Cho, Suwon-si (KR); Jongah Kim, Suwon-si (KR); Heewoong Yoon, Suwon-si (KR); Donghan Lee, Suwon-si (KR); Kyusung Kim, Suwon-si (KR); Chanhyoung Park, Suwon-si (KR); Eunsook Seo, Suwon-si (KR); Taewoong Lee, Suwon-si (KR); Euntaek Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/681,159

(22) Filed: Nov. 12, 2019

(65) Prior Publication Data

US 2020/0152724 A1     May 14, 2020

(30) Foreign Application Priority Data

Nov. 13, 2018     (KR) .................. 10-2018-0138868

(51) Int. Cl.
| | | |
|---|---|---|
| *H01L 27/32* | (2006.01) | |
| *G06F 3/041* | (2006.01) | |
| *G09G 3/20* | (2006.01) | |
| *G09G 3/3225* | (2016.01) | |

(52) U.S. Cl.
CPC ........ *H01L 27/3269* (2013.01); *G06F 3/0412* (2013.01); *G09G 3/2003* (2013.01);
(Continued)

(58) Field of Classification Search
CPC ............... H01L 27/3269; H01L 27/323; H01L 27/3227; G06F 3/0412; G09G 3/2003;
(Continued)

(56) References Cited

U.S. PATENT DOCUMENTS

| | | |
|---|---|---|
| 2012/0092521 A1 | 4/2012 | Lee |
| 2014/0145150 A1 | 5/2014 | De Jong et al. |

(Continued)

FOREIGN PATENT DOCUMENTS

| | | |
|---|---|---|
| CN | 108021161 A | 5/2018 |
| EP | 3 291 516 A1 | 3/2018 |

(Continued)

OTHER PUBLICATIONS

International Search Report and Written Opinion Report dated Feb. 21, 2020, issued in Application No. PCT/KR2019/015434.

(Continued)

*Primary Examiner* — Sahlu Okebato
(74) *Attorney, Agent, or Firm* — Jefferson IP Law, LLP

(57) ABSTRACT

An electronic device is provided. The electronic device includes a housing including a front surface and a rear surface facing, a display exposed through a portion of the front surface, an illuminance sensor disposed between the display and the rear surface to overlap an area of the display when viewed from above the front surface, a processor positioned inside the housing and operatively connected with the display, and a memory positioned inside the housing and operatively connected with the processor, wherein the memory stores instructions configured to, when executed, enable the processor to receive first illuminance data measured using the illuminance sensor, identify display parameter information associated with the first illuminance data, obtain second illuminance data based on at least a part of the display parameter information and the first illumi-
(Continued)

nance data, and adjust a brightness of the display based on at least a part of the second illuminance data.

15 Claims, 12 Drawing Sheets

(52) U.S. Cl.
 CPC ......... *G09G 3/3225* (2013.01); *H01L 27/323* (2013.01); *H01L 27/3227* (2013.01); *G09G 2320/0242* (2013.01); *G09G 2320/0626* (2013.01); *G09G 2360/144* (2013.01)

(58) Field of Classification Search
 CPC ......... G09G 3/3225; G09G 2320/0242; G09G 2360/144; G09G 2320/0626
 See application file for complete search history.

(56) References Cited

U.S. PATENT DOCUMENTS

| | | |
|---|---|---|
| 2017/0092228 A1 | 3/2017 | Cote et al. |
| 2017/0221450 A1* | 8/2017 | Kim ................... G06F 1/1637 |
| 2018/0061313 A1 | 3/2018 | Jang et al. |
| 2018/0063435 A1 | 3/2018 | Cho et al. |
| 2018/0357952 A1* | 12/2018 | Yang ................... H01L 27/326 |
| 2019/0155501 A1 | 5/2019 | Zhang et al. |
| 2021/0241017 A1* | 8/2021 | Kato .................. H05K 13/0812 |

FOREIGN PATENT DOCUMENTS

| | | |
|---|---|---|
| GN | 107818753 A | 3/2018 |
| JP | 5264446 B2 | 8/2013 |
| KR | 10-2012-0038203 A | 4/2012 |
| KR | 10-2017-0090522 A | 8/2017 |
| KR | 10-2018-0024526 A | 3/2018 |

OTHER PUBLICATIONS

Extended European Search Report dated Jul. 15, 2021, issued in European Patent Application No. 19885182.6.

* cited by examiner

ELECTRONIC DEVICE AND ILLUMINANCE SENSING METHOD BASED ON DISPLAY INFORMATION ON ELECTRONIC DEVICE

CROSS-REFERENCE TO RELATED APPLICATION(S)

This application is based on and claims priority under 35 U.S.C. § 119(a) of a Korean patent application number 10-2018-0138868, filed on Nov. 13, 2018, in the Korean Intellectual Property Office, the disclosure of which is incorporated by reference herein in its entirety.

BACKGROUND

1. Field

The disclosure relates to illuminance sensing by an electronic device.

2. Description of Related Art

Advancing information communication and semiconductor technologies accelerate the spread and use of various electronic devices. In particular, recent electronic devices may perform communication while being carried and may include one or more sensors for obtaining various types of ambient information. A sensor in an electronic device may obtain various pieces of information. There may be a diversity of types of sensors depending on information to be obtained.

An optical sensor is among various sensors of an electronic device. An optical sensor may detect light and perform various sensing operations based on, at least, sensing of light.

Optical sensors include proximity sensors and illuminance sensors that detect external light of an electronic device, namely, ambient brightness.

Optical sensors may be arranged around a component of an electronic device, which may influence the electronic device's detection of external light. For example, the component which may influence the detection of external light may be a display.

At least one of the color, brightness, or transmittance of a display may affect external light which is sensed by an optical sensor. When an optical sensor is placed around a display, it may detect light under the influence of the display of the electronic device and may thus have difficulty in precisely obtaining the illuminance of external light. For example, even when the outside of the electronic device is dark, the optical sensor may detect light which has been brightened by the display, resultantly ending up determining that the light detection information (e.g., illuminance) by the external light is higher than the actual illuminance in the dark environment.

The external light detection information obtained by the optical sensor may be provided to other components of the electronic device for use in various functions. When incorrect external light detection information is provided from the optical sensor, various functions which use the external light detection information may be performed incorrectly. For example, when the brightness of the display is adjusted using the external light detection information, incorrect detection of the external light may result in the brightness of the display being adjusted incorrectly.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device capable of precisely detecting external light which has not been influenced by the display and a method of sensing illuminance based on display information by the electronic device.

Another aspect of the disclosure is to provide an electronic device capable of adjusting the brightness of the display to a brightness at which the user's eyes do not feel tired according to precise external light information which has not been influenced by the display and a method of sensing illuminance based on display information by the electronic device.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a front surface and a rear surface facing away from the front surface, a display included in the housing and exposed through a portion of the front surface, an illuminance sensor disposed between the display and the rear surface to overlap an area of the display when viewed from above the front surface, a processor positioned inside the housing and operatively connected with the display, and a memory positioned inside the housing and operatively connected with the processor, wherein the memory stores instructions configured to, when executed, enable the processor to receive first illuminance data measured using the illuminance sensor, identify display parameter information associated with the first illuminance data, obtain second illuminance data based on at least a part of the display parameter information and the first illuminance data, and adjust a brightness of the display based on at least a part of the second illuminance data.

In accordance with another aspect of the disclosure, an electronic device is provided. The electronic device includes a housing including a first plate and a rear plate facing away from the first plate, a touchscreen display included in the housing, configured to be viewed through a portion of the first plate, and including at least one pixel, an illuminance sensor disposed between the touchscreen display and the rear plate to overlap at least one pixel of the touchscreen display when viewed from above the first plate, a processor positioned inside the housing and operatively connected with the touchscreen display and the illuminance sensor, and a memory positioned inside the housing and operatively connected with the processor, wherein the memory stores instructions configured to, when executed, enable the processor to receive, from the illuminance sensor, an amount of light measured during a first time period by the illuminance sensor while the touchscreen display is operated, calculate a first illuminance value based on at least a part of the received amount of light, identify parameter information related to the at least one pixel of the touchscreen display during the first period or at a time of termination of the first period, determine a second illuminance value based on at least a part of the identified parameter information and the calculated first illuminance value, and adjust a brightness of the touchscreen display based on at least a part of the determined second illuminance value.

In accordance with another aspect of the disclosure, a method of sensing illuminance by an electronic device is provided. The method includes receiving first illuminance data measured using an illuminance sensor, identifying display parameter information associated with the first illuminance data, obtaining second illuminance data based on at least a part of the display parameter information and the first illuminance data, and adjusting a brightness of the display based on at least a part of the second illuminance data.

In accordance with another aspect of the disclosure, a non-transitory storage medium is provided. The non-transitory storage medium includes storing instructions configured to be executed by at least one circuit to enable the at least one circuit to perform at least one operation, the at least one operation comprising receiving first illuminance data measured using an illuminance sensor, identifying display parameter information associated with the first illuminance data, obtaining second illuminance data based on at least a part of the display parameter information and the first illuminance data, and adjusting a brightness of the display based on at least a part of the second illuminance data.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
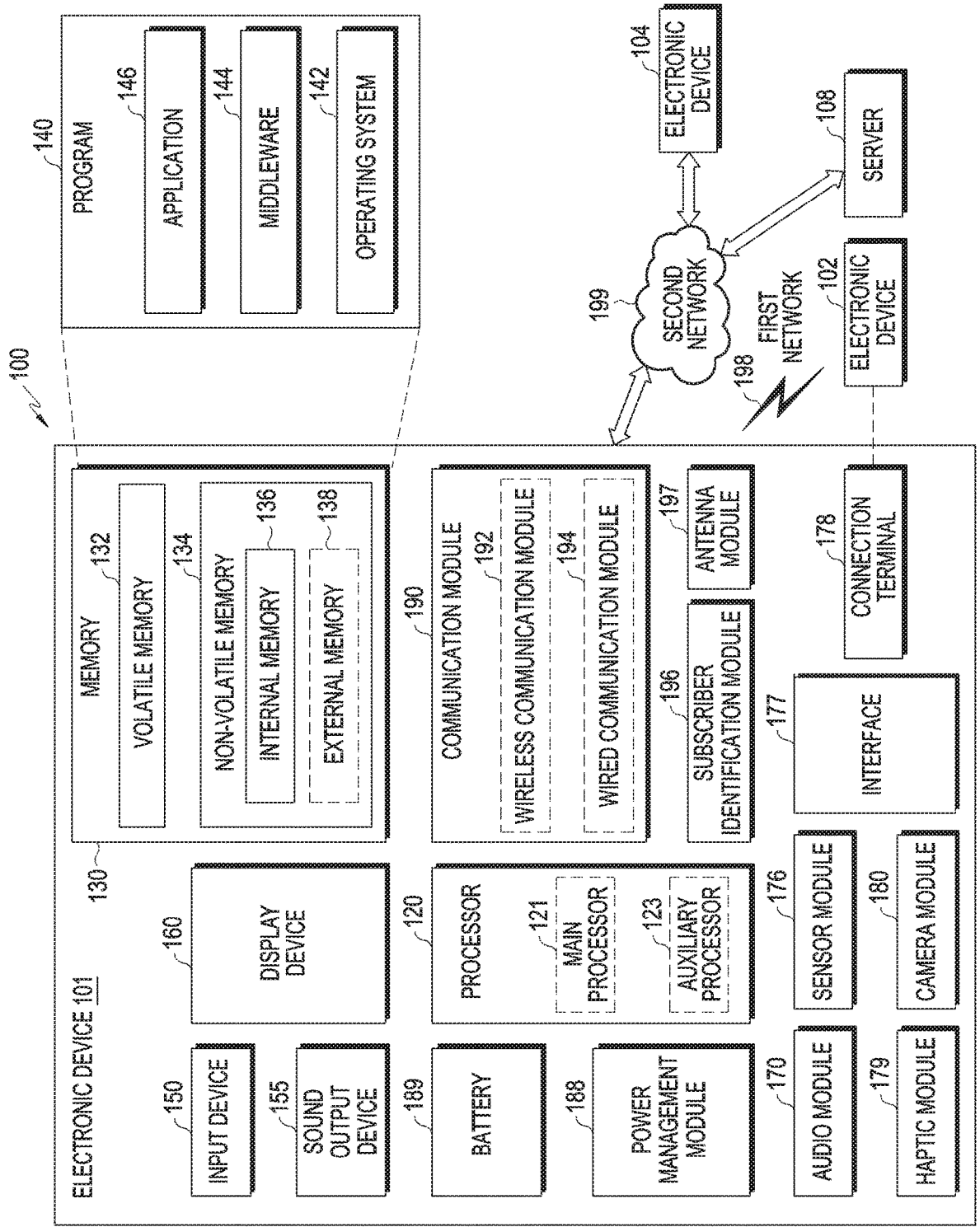
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network) or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120 and may perform various data processing or computation. According to one embodiment, as at least a part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121 or to be specific to a specified function. The auxiliary processor 123 may be implemented as separate from or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101 from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing recordings, and the receiver may be used for an incoming calls. According to an embodiment, the receiver may be implemented as separate from or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 1801, and generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his or her tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 388 may be implemented as at least a part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device). According to an embodiment, the antenna module may include one antenna including a radiator formed of a conductor or conductive pattern formed on a substrate (e.g., a printed circuit board (PCB)). According to an embodiment, the antenna module 197 may include a plurality of antennas. In this case, at least one antenna appropriate for a communication scheme used in a communication network, such as the first network 198 or the second network 199, may be selected from the plurality of antennas by, e.g., the communication module 190. The signal or the power may be transmitted or received between the communication module 190 and the external electronic device via the selected at least one antenna. According to an embodiment, other parts (e.g., radio frequency integrated circuit (RFIC)) than the radiator may be further formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, instructions or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least a part of the function or the service. The one or more external electronic devices receiving the request may perform the at least a part of the function or the service requested, or an additional function or an additional service related to the request, and transfer an outcome of the performing to the electronic device 101. The electronic device 101 may provide the outcome, with or without further processing of the outcome, as at least a part of a reply to the request. To that end, a cloud computing, distributed computing, or client-server computing technology may be used, for example.

Figure 2:
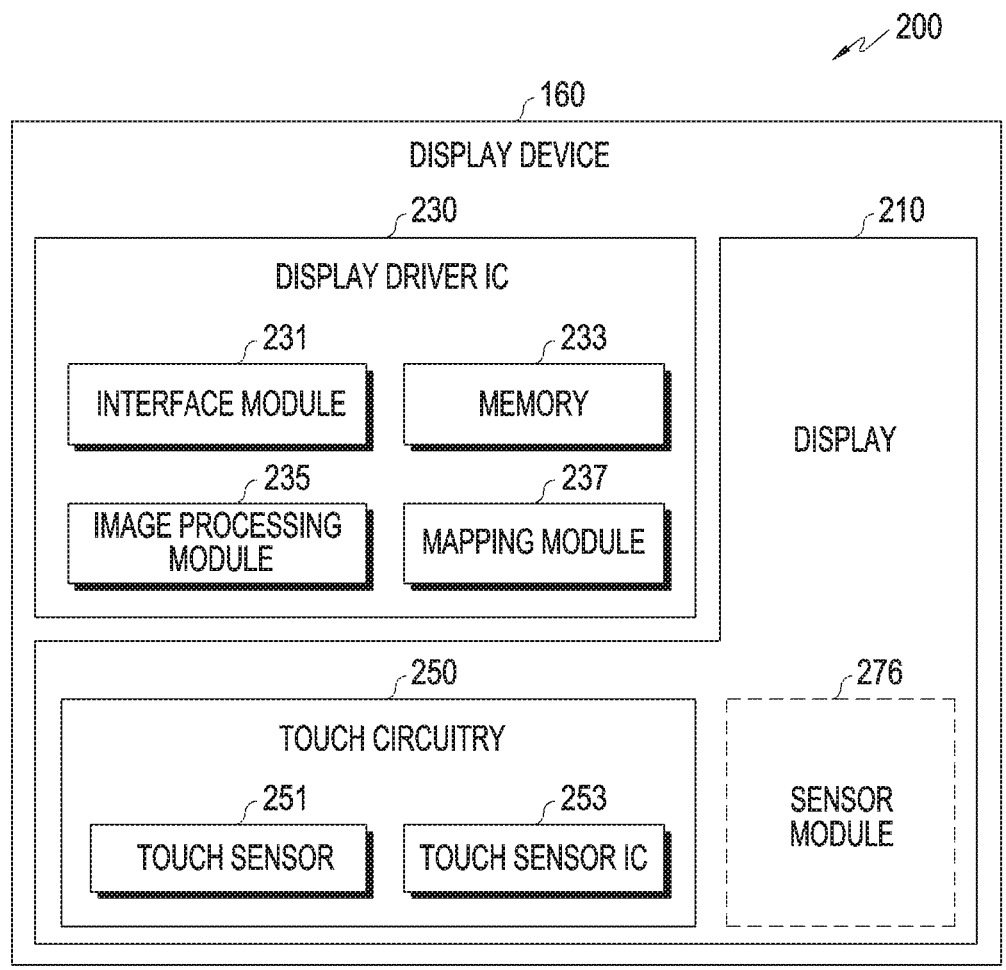
FIG. 2 is a block diagram illustrating a display device according to an embodiment of the disclosure.

FIG. 2 is a block diagram illustrating a display device according to an embodiment of the disclosure.

Referring to FIG. 2, block diagram 200 illustrates a display device 160 that may include a display 210 and a display driver integrated circuit (DDI) 230 to control the display 110. The DDI 230 may include an interface module 231, memory 233 (e.g., buffer memory), an image processing module 235, or a mapping module 237. The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry 250 or the sensor module 176 via the interface module 231. The DDI 230 may also store at least a part of the received image information in the memory 233, for example, on a frame by frame basis. The image processing module 235 may perform pre-processing or post-processing (e.g., adjustment of resolution, brightness, or size) with respect to at least a part of the image data. According to an embodiment, the pre-processing or post-processing may be performed, for example, based at least in part on one or more characteristics of the image data or one or more characteristics of the display 210. The mapping module 237 may generate a voltage value or a current value corresponding to the image data pre-processed or post-processed by the image processing module 135. According to an embodiment, the generating of the voltage value or current value may be performed, for example, based at least in part on one or more attributes of the pixels (e.g., an array, such as an RGB stripe or a pentile structure, of the pixels, or the size of each subpixel) of the display 210. At least some pixels of the display 210 may be driven, for example, based at least in part on the voltage value or the current value such that visual information (e.g., a text, an image, or an icon) corresponding to the image data may be displayed via the display 210.

According to an embodiment, the display device 160 may further include the touch circuitry 250. The touch circuitry 250 may include a touch sensor 251 and a touch sensor IC 253 to control the touch sensor 151. The touch sensor IC 253 may control the touch sensor 251 to sense a touch input or a hovering input with respect to a certain position on the display 210. To achieve this, for example, the touch sensor IC 253 may detect (e.g., measure) a change in a signal (e.g., a voltage, a quantity of light, a resistance, or a quantity of one or more electric charges) corresponding to the certain position on the display 210. The touch sensor IC 253 may provide input information (e.g., a position, an area, a pressure, or a time) indicative of the touch input or the hovering input detected to the processor 120. According to an embodiment, at least a part (e.g., the touch sensor IC 253) of the touch circuitry 250 may be formed as part of the display 210 or the DDI 230, or as part of another component (e.g., the auxiliary processor 123) disposed outside the display device 160.

According to an embodiment, the display device 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 250)) of the display device 160. For example, when the sensor module 176 embedded in the display device 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display device 160 includes a pressure sensor, the pressure sensor may obtain pressure information corresponding to a touch input received via a partial or whole area of the display 210. According to an embodiment, the touch sensor 251 or the sensor module 176 may be disposed between pixels in a pixel layer of the display 210, or over or under the pixel layer.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smartphones) directly. If distributed online, at least a part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 3A:
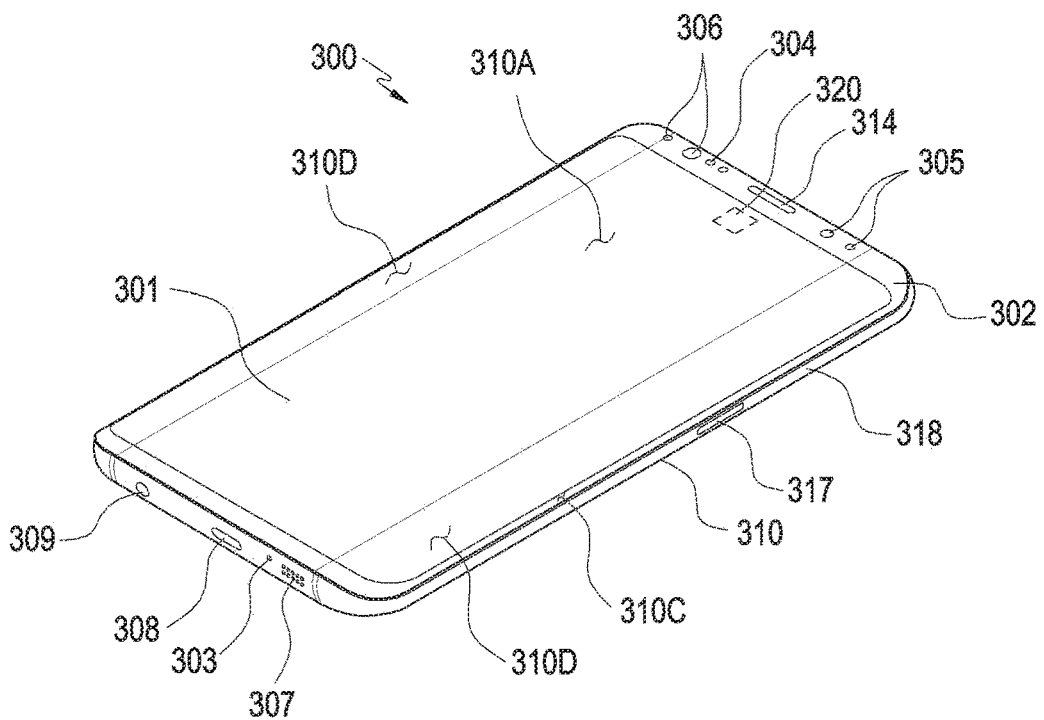
FIG. 3A is a front perspective view illustrating an electronic device according to an embodiment of the disclosure.

FIG. 3A is a front perspective view illustrating an electronic device according to an embodiment of the disclosure.

Figure 3B:
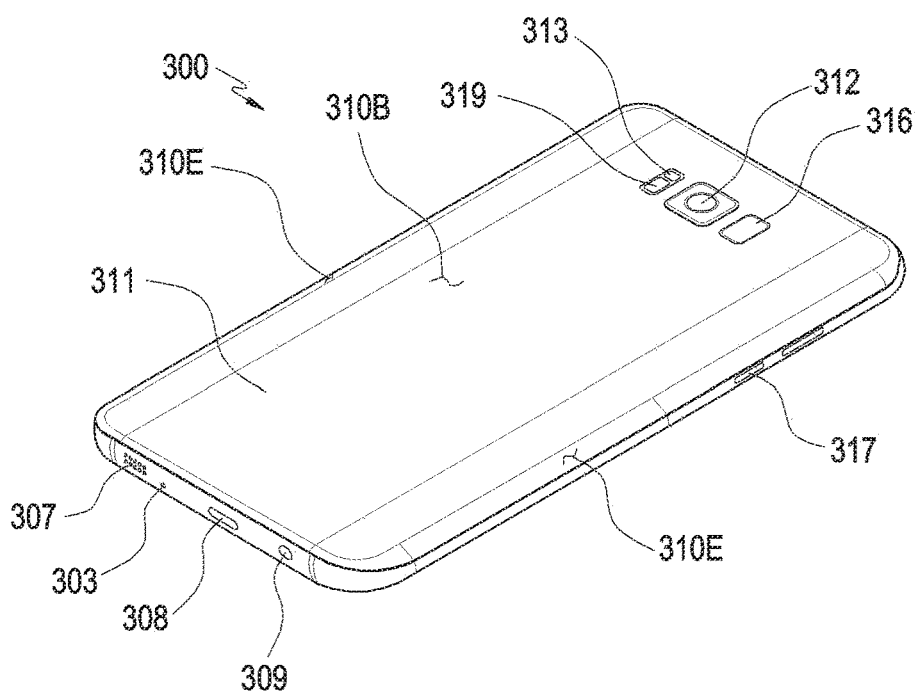
FIG. 3B is a rear perspective view illustrating an electronic device according to an embodiment of the disclosure.

FIG. 3B is a rear perspective view illustrating an electronic device according to an embodiment of the disclosure.

Referring to FIGS. 3A and 3B, according to an embodiment, an electronic device 300 may include a housing 310 with a first (or front) surface 310A, a second (or rear) surface 310B, and a side surface 310C surrounding a space between the first surface 310A and the second surface 310B. According to another embodiment (not shown), the housing may denote a structure forming part of the first surface 310A, the second surface 310B, and the side surface 310C of FIGS. 3A and 3B. According to an embodiment, at least a part of the first surface 310A may have a substantially transparent front plate 302 (e.g., a glass plate or polymer plate including various coating layers). The second surface 310B may be formed of a substantially opaque rear plate 311. The rear plate 311 may be formed of, e.g., laminated or colored glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. According to an embodiment, the rear plate 311 and the side bezel plate 318 may be integrally formed together and include the same material (e.g., a metal, such as aluminum).

In the embodiment illustrated, the front plate 302 may include two first regions 310D, which seamlessly and bendingly extend from the first surface 310A to the rear plate 311, on both the long edges of the front plate 302. In the embodiment (refer to FIG. 3B) illustrated, the rear plate 311 may include second regions 310E, which seamlessly and bendingly extend from the second surface 310B to the front plate, on both the long edges. According to an embodiment, the front plate 302 (or the rear plate 311) may include only one of the first regions 310D (or the second regions 310E). Alternatively, the first regions 310D or the second regions 310E may partially be excluded. According to an embodiment, at a side view of the electronic device 300, the side bezel structure 318 may have a first thickness (or width) for sides that do not have the first regions 310D or the second regions 310E and a second thickness, which is smaller than the first thickness, for sides that do have the first regions 310D or the second regions 310E.

According to an embodiment, the electronic device 300 may include at least one or more of a display 301, audio modules 303, 307, and 314, sensor modules 304, 316, and 319, camera modules 305, 312, and 313, a key input device 317, a light emitting device 306, and connector holes 308 and 309. According to an embodiment, the electronic device 300 may exclude at least one (e.g., the key input device 317 or the light emitting device 306) of the components or may add other components.

The display 301 may be exposed through a considerable portion of, e.g., the front plate 302. According to an embodiment, at least a portion of the display 301 may be exposed through the front plate 302 forming the first surface 310A and the first regions 310D of the side surface 310C. According to an embodiment, the edge of the display 301 may be formed to be substantially the same in shape as an adjacent outer edge of the front plate 302. According to an embodiment (not shown), the interval between the outer edge of the display 301 and the outer edge of the front plate 302 may remain substantially even to give a larger area of exposure for the display 301.

According to an embodiment (not shown), the screen display region of the display 301 may have a recess or opening in a portion thereof, and at least one or more of the audio module 314, the sensor module 304, the camera module 305, and the light emitting device 306 may be aligned with the recess or opening. According to an embodiment (not shown), at least one or more of the audio module 314, the sensor module 304, the camera module 305, the fingerprint sensor 316, and the light emitting device 306 may be included on the rear surface of the screen display region of the display 301. According to an embodiment (not shown), the display 301 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least a part of the sensor modules 304 and 319 and/or at least a part of the key input device 317 may be disposed in the first regions 310D and/or the second regions 310E.

The audio modules 303, 307, and 314 may include a microphone hole 303 and speaker holes 307 and 314. The microphone hole 303 may have a microphone inside to obtain external sounds. According to an embodiment, there may be a plurality of microphones to be able to detect the direction of a sound. The speaker holes 307 and 314 may include an external speaker hole 307 and a phone receiver hole 314. According to an embodiment, the speaker holes 307 and 314 and the microphone hole 303 may be implemented as a single hole, or speakers may be rested without the speaker holes 307 and 314 (e.g., piezo speakers).

The sensor modules 304, 316, and 319 may generate an electrical signal or data value corresponding to an internal operating state or external environmental state of the electronic device 300. The sensor modules 304, 316, and 319 may include a first sensor module 304 (e.g., a proximity sensor) and/or a second sensor module (not shown) (e.g., a fingerprint sensor) disposed on the first surface 310A of the housing 310 and/or a third sensor module 319 (e.g., a heart-rate monitor (HRM) sensor) and/or a fourth sensor module 316 (e.g., a fingerprint sensor) disposed on the second surface 310B of the housing 310. The fingerprint sensor may be disposed on the second surface 310B as well as on the first surface 310A (e.g., the display 301) of the housing 310. The electronic device 300 may further include an illuminance sensor 320. The illuminance sensor 320 may be disposed between the display 301 and the second surface (or rear surface) 310B to overlap an area of the display 301 as viewed from above the first surface (or front surface) 310A of the housing 310.

The electronic device 300 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, or a humidity sensor.

The camera modules 305, 312, and 313 may include a first camera device 305 disposed on the first surface 310A of the electronic device 300, and a second camera device 312 and/or a flash 313 disposed on the second surface 310B. The camera modules 305 and 312 may include one or more lenses, an image sensor, and/or an image signal processor. The flash 313 may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 300.

The key input device 317 may be disposed on the side surface 310C of the housing 310. According to an embodiment, the electronic device 300 may exclude all or some of the above-mentioned key input devices 317 and the excluded key input devices 317 may be implemented in other forms, e.g., as soft keys, on the display 301. According to an embodiment, the key input device may include the sensor module 316 disposed on the second surface 310B of the housing 310.

The light emitting device 306 may be disposed on, e.g., the first surface 310A of the housing 310. The light emitting device 306 may provide, e.g., information about the state of the electronic device 300 in the form of light. According to an embodiment, the light emitting device 306 may provide a light source that interacts with, e.g., the camera module 305. The light emitting device 306 may include, e.g., a light emitting device (LED), an infrared (IR) LED, or a xenon lamp.

The connector holes 308 and 309 may include a first connector hole 308 for receiving a connector (e.g., a universal serial bus (USB) connector) for transmitting or receiving power and/or data to/from an external electronic device and/or a second connector hole 309 (e.g., an earphone jack) for receiving a connector for transmitting or receiving audio signals to/from the external electronic device.

Figure 3C:
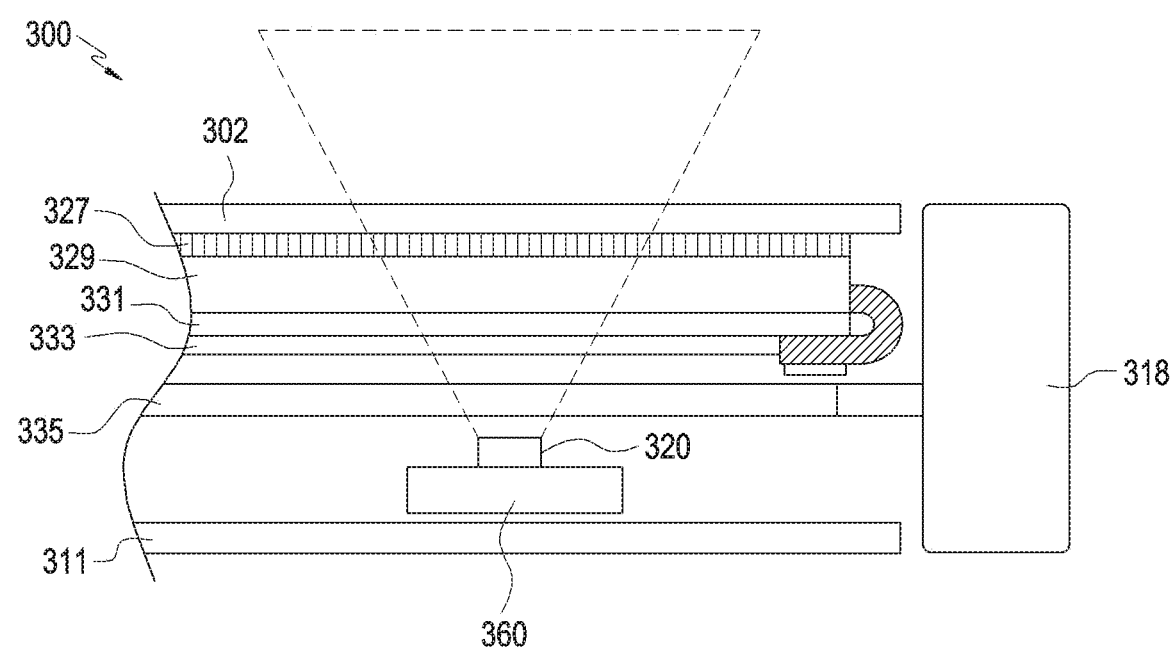
FIG. 3C is a cross-sectional view illustrating an electronic device according to an embodiment of the disclosure.

FIG. 3C is a cross-sectional view illustrating an electronic device according to an embodiment of the disclosure.

Referring to FIG. 3C, according to an embodiment, a first plate 302, a touchscreen panel 327, a display panel 329, a digitizer panel 331, a shielding layer 333, and a mid plate 335 may be stacked along a direction from a first surface (or front surface) 310A to a second surface (or rear surface) 310B. As viewed in the direction from the first surface (or front surface) 310A to the second surface (or rear surface) 310B, an illuminance sensor 320 may be disposed between the display panel 329 and the rear plate 311 to overlap an area of the display panel 329. According to an embodiment, the order of stacking the touchscreen panel 327 and the display panel 329 may be varied. The first plate 302 may be formed of glass. According to an embodiment, the first plate 302 may be formed of a transparent resin, without being limited to glass.

According to an embodiment, the display 301 may include the first plate 302, the display panel 329, and/or the touchscreen panel 327. The display 301 may display a screen according to a designated screen ratio (e.g., 18.5:9 (default) or 21:9). According to an embodiment, the display 301 may display a user interface according to a floating mode or a split mode. According to an embodiment, the display 301 may display a user interface including an application area or a control area. The display 301 may display a control object (e.g., a soft key) on the control area. According to an embodiment, the display 301 may have a Y-OCTA structure, and the touchscreen panel 327 may be attached to the display panel 329 in an add-on-cell type.

According to an embodiment, the touchscreen panel 327 may receive a user touch input on the first plate 302. The touchscreen panel 327 may receive an electrical signal of the user's touch input. The touchscreen panel 327 may have the same size as the first plate 302 and may receive an electrical signal of the same coordinates as the coordinates of the touch input on the first plate 302. According to an embodiment, the touchscreen panel 327 is not limited to the same size as the first plate 302 but may rather be larger or smaller than the first plate 302. The touchscreen panel 327 may be driven in a capacitive type including RX electrodes and TX electrodes. According to an embodiment, the touchscreen panel 327 is not limited to the capacitive type but may rather be driven in a pressurizing type or an optical type. The RX electrodes and the TX electrodes may be arrayed on the same layer. According to an embodiment, the RX electrodes and the TX electrodes are not limited to being arrayed on the same layer but may rather be arrayed on different layers.

The display panel 329 may include a plurality of pixels including red (R) subpixels, green (G) subpixels, and blue (B) subpixels. As data and current are provided to each of the plurality of pixels, the display panel 329 may output an image in a combination of the colors of the subpixels of the pixels.

The shielding layer 333 may be electrically connected with the ground of the digitizer panel 331 or display panel 329. The shielding layer 333 may absorb noise signals through the ground. The shielding layer 333 may be attached to the housing 310, with a dielectric interposed therebetween to prevent itself from being grounded along with the housing 310. The shielding layer 333 may include a copper sheet.

According to an embodiment, the illuminance sensor 320 may be disposed under the mid plate 335 and may include a light receiving unit for receiving external light incident from the outside of the electronic device 300 through the display 301. A circuit board 360 may be disposed on the bottom of the illuminance sensor 320.

According to an embodiment, various electronic components, e.g., a processor (e.g., the processor 120) or a communication module (e.g., the communication module 190), may be mounted on the circuit board 360. The circuit board 360 may be fastened to the housing 310 by a coupling member (not shown), e.g., a screw. The circuit board 360 may be electrically connected with the housing 310 to be utilized as a ground for the antenna. According to an embodiment, the circuit board 360 is not limited as utilized as a ground but may rather be used as a feeder for applying current to the antenna radiator. For example, the circuit board 360 may include a printed circuit board (PCB).

According to an embodiment, a side member 318 may be combined with the first plate 302 and the rear plate 311 and may include a metal and/or polymer. According to an embodiment, the rear plate 311 and the side member (e.g., a bezel structure or housing antenna) 318 may be integrally formed together and include the same material (e.g., a metal, such as aluminum). The side member 318 may be used as a housing antenna. According to an embodiment, when the side member 318 is used as a housing antenna, the side member 318 may be electrically connected with a wireless communication module (e.g., the wireless communication module 192) disposed on the circuit board 360 via a connecting member.

Figure 4:
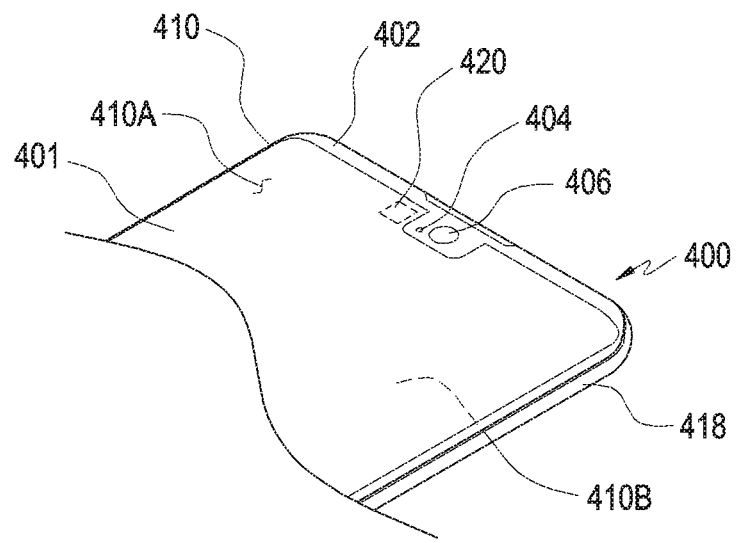
FIGS. 4 and 5 are perspective views illustrating front surfaces of an electronic device according to various embodiments of the disclosure.
Figure 5:
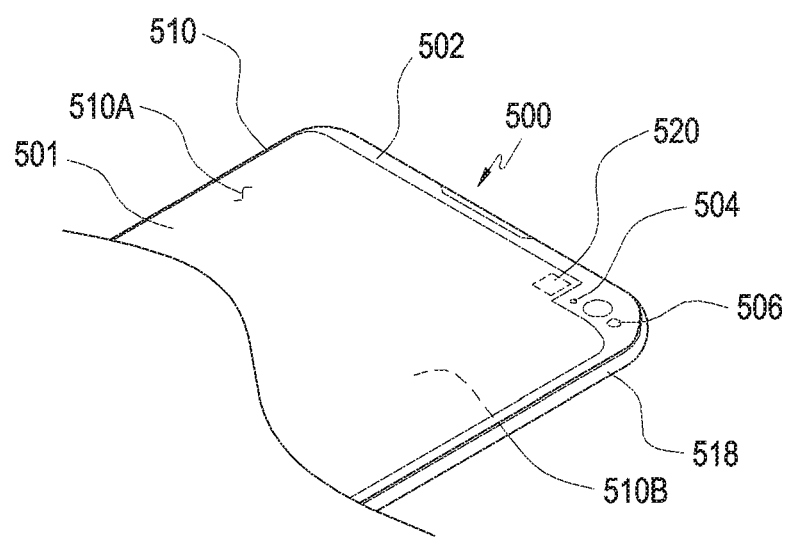

FIGS. 4 and 5 are perspective views illustrating front surfaces of an electronic device according to various embodiments of the disclosure.

Referring to FIG. 4, according to an embodiment, an electronic device 400 may include a light emitting element 404 and a camera module 406 on a top middle portion of a first surface (or front surface) 410A included in a housing 410. The housing 410 may include a bezel member 402 disposed in the top of the display 401 and a side portion 418. An illuminance sensor 420 may be disposed between a display 401 and a second surface (or rear surface) 410B to overlap an area of the display 401 which is positioned adjacent the top middle portion of the front surface 410A as viewed from above the first surface (or front surface) 410A included in the housing 410.

Referring to FIG. 5, according to an embodiment, an electronic device 500 may include a light emitting element 504 and a camera module 506 on a top right portion of a first surface (or front surface) 510A included in a housing 510. The housing 510 may include a bezel member 502 disposed in the top of the display 501 and a side portion 518. An illuminance sensor 520 may be disposed between a display 501 and a second surface (or rear surface) 510B to overlap an area of the display 501 which is positioned adjacent the top right portion of the front surface 510A as viewed from above the first surface (or front surface) 510A included in the housing 510.

According to an embodiment, the illuminance sensor (e.g., 320 of FIG. 3A, 420 of FIG. 4, or 520 of FIG. 5) may be placed in other various positions than that described above. When the illuminance sensor is disposed adjacent the display (e.g., 160 of FIGS. 1 and 2, 301 of FIG. 3A, 401 of FIG. 4, or 501 of FIG. 5) (e.g., when the illuminance sensor is disposed under the display or when the illuminance sensor is disposed between the display and the rear surface to overlap an area of the display as viewed from above the front surface of the electronic device), external light incident onto the illuminance sensor may be influenced by the display. For example, the brightness component according to the color, brightness, or transmittance of an image output from the display (e.g., 160 of FIGS. 1 and 2, 301 of FIG. 3A, 401 of FIG. 4, or 501 of FIG. 5) may affect the external light incident onto the illuminance sensor.

Figure 6:
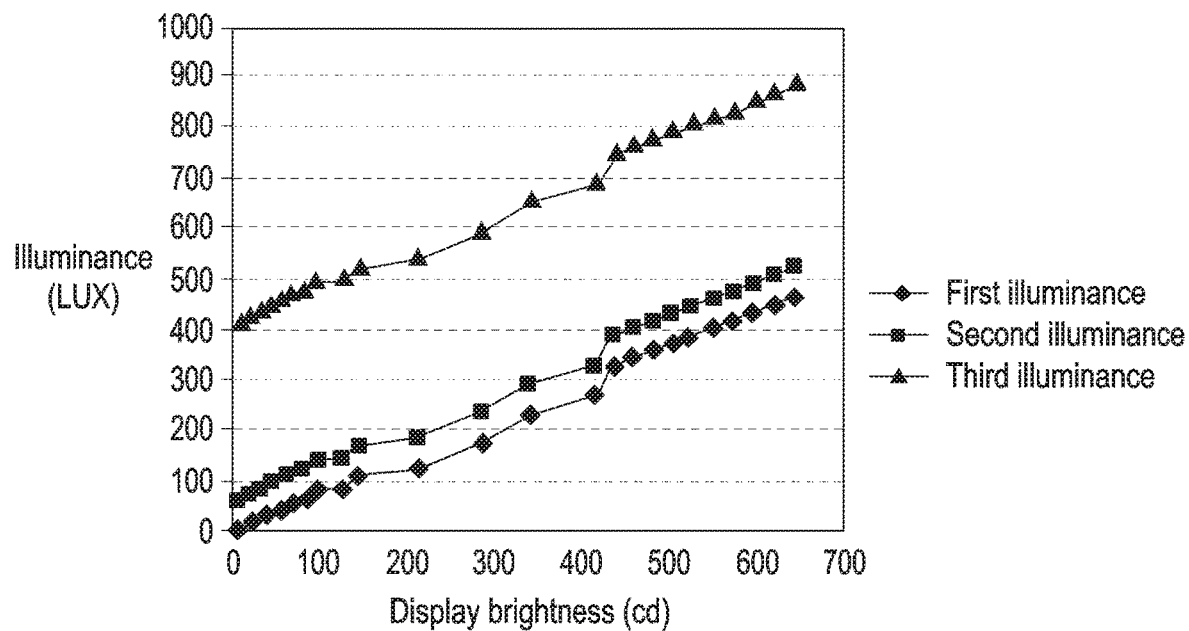
FIG. 6 is a view illustrating an illuminance value measured when an illuminance sensor is influenced by a display according to an embodiment of the disclosure.

FIG. 6 is a view illustrating an illuminance value measured when an illuminance sensor is influenced by a display according to an embodiment of the disclosure.

Referring to FIG. 6, the horizontal axis may denote the brightness value (candela (cd)) according to the color, brightness, or transmittance of an image output from the display (e.g., 160 of FIGS. 1 and 2, 301 of FIG. 3A, 401 of FIG. 4, or 501 of FIG. 5), and the vertical axis may denote the illuminance value (lux) measured by an illuminance sensor (e.g., 320 of FIG. 3A, 420 of FIG. 4, or 520 of FIG. 5) when the image is output from the display.

According to an embodiment, a first illuminance may indicate a state in which external light is blocked off, a dark-room state, or a zero-lux state, a second illuminance may indicate a state in which the brightness of external light is low or a 66-lux state, and a third illuminance may indicate a state in which the brightness of external light is high or a 460-lux state. In a zero-brightness state in which no image is output on the display in each illuminance environment, the first illuminance to the third illuminance may be measured relatively precisely. According to an embodiment, when the display outputs an image, a brightness component may be produced by the color, brightness, or transmittance of the output image and the illuminance value measured by the illuminance sensor may be higher than the illuminance value in the original illuminance environment in proportion to the brightness component produced by the display. For example, the illuminance sensor may measure the external light which has been influenced by the light of the image output from the display, thus resulting in a failure to obtain the precise illuminance for the external light.

Figure 7:
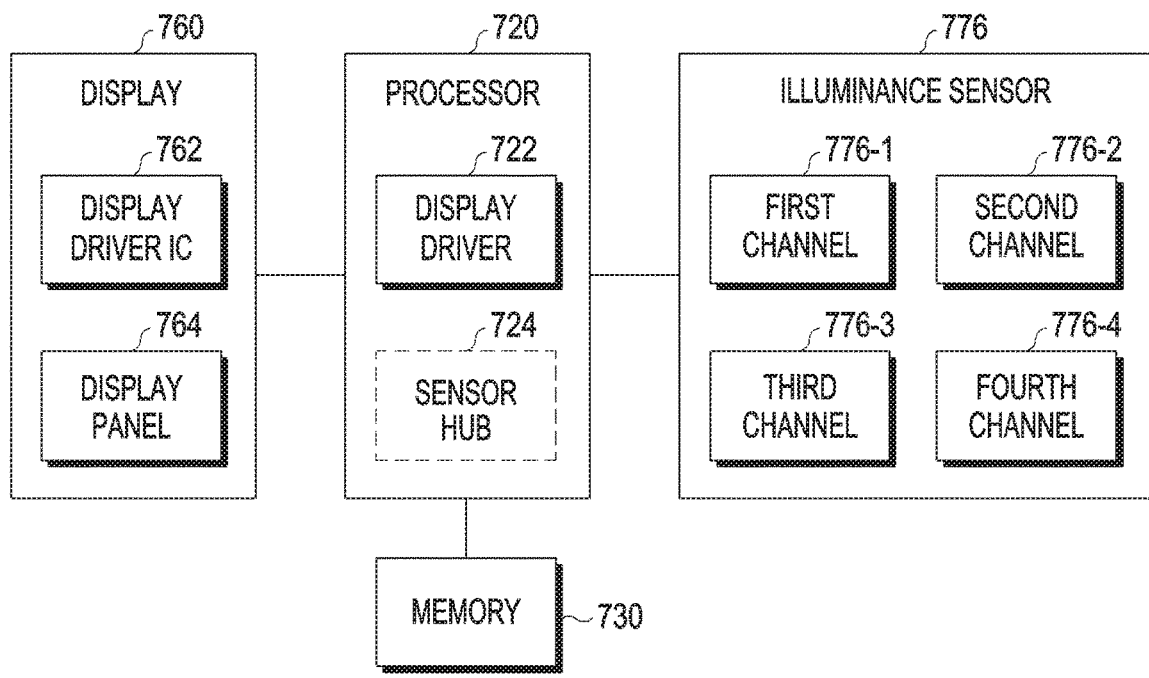
FIG. 7 is a block diagram illustrating an electronic device according to an embodiment of the disclosure.

FIG. 7 is a block diagram illustrating an electronic device according to an embodiment of the disclosure.

Referring to FIG. 7, according to an embodiment, an electronic device 700 (e.g., the electronic device 101 of FIG. 1, the electronic device 300 of FIG. 3, the electronic device 400 of FIG. 4, or the electronic device 500 of FIG. 5) may include a processor 720, a memory 730, a display 760, and an illuminance sensor 776.

According to an embodiment, the processor 720 (e.g., the processor 120 of FIG. 1) may execute software (e.g., the program 140) to control at least one other component (e.g., the memory 730, the display 760, or the illuminance sensor 776) of the electronic device 700 electrically connected with the processor 720 and may perform various types of data processing or computation. According to an embodiment, the processor 720 may be an application processor (AP) and may include a display driver 722 or a sensor hub 724 or perform the function of the display driver 722 or the sensor hub 724. The display driver 722 may communicate with a display driver integrated circuit (IC) 762 of the display 760 and may provide image information that is to be output through the display 760. The sensor hub 724 may control the overall driving of sensors (at least one sensor module including the illuminance sensor 776) included in the electronic device 700, store or obtain a display brightness table, and provide a display brightness, corresponding to second illuminance data which has been corrected as first illuminance data measured by the illuminance sensor 776 is corrected, to the display driver IC 762.

According to an embodiment, the processor 720 may receive the first illuminance data measured using the illuminance sensor 776, identify display parameter information associated with the first illuminance data, obtain the second illuminance data based on the display parameter information and the first illuminance data, and adjust the brightness of the display based on the second illuminance data. According to an embodiment, the display parameter information associated with the first illuminance data may include information associated with at least one of the color, the brightness, or the transmittance of the display 760 at the time of measuring the first illuminance data. According to an embodiment, the display parameter information associated with the first illuminance data may include color on pixel ratio (COPR) information associated with the image output from the display 760 at the time of measurement of the first illuminance data. For example, the COPR information may be a ratio of the R, G, and B values of the image output from the display 760. According to an embodiment, the display parameter information associated with the first illuminance data may include active matrix organic light emitting diode (AMOLED) off ratio (AOR) information associated with the display 760 at the time of measurement of the first illuminance data.

According to an embodiment, the processor 720 may receive the first illuminance data measured during a designated time (e.g., 50 ms) from the illuminance sensor 776 and may receive an interrupt signal along with the first illuminance data. The processor 720 may receive display parameter information in each image frame (e.g., 16.6 ms) which is output from the display 760 and may identify that the display parameter information at the time of reception of the interrupt signal is the display parameter information associated with the first illuminance data.

According to an embodiment, the processor 720 may receive the first illuminance data, identify display parameter information (e.g., first display parameter information) associated with the first illuminance data, obtain correction information using illuminance raw data corresponding to the display parameter information (e.g., second display parameter information), with the external light blocked off, and correct the first illuminance data using the correction information. According to an embodiment, the illuminance raw data may be data obtained based on the illuminance value detected by the illuminance sensor 776 when the electronic device 700 outputs an image on the display 760 in a dark room (which is a zero-lux place).

According to an embodiment, the illuminance raw data may be a value obtained as the illuminance sensor senses the light which results from the image which the display 760 outputs based on the R, G, and B values, with light blocked off from the outside. For example, the illuminance sensor may sense the light, which results from the image output from the display 760 with light blocked off from the outside, using R, G, B, and C channels, thereby obtaining an R channel sensing value, a G channel sensing value, a B channel sensing value, and a C channel sensing value. The R channel sensing value may be the sensing value for the R channel component of the light which results from the image output from the display 760 with light blocked off from the outside, the G channel sensing value may be the sensing value for the G channel component of the light which results from the image output from the display 760 with light blocked off from the outside, the B channel sensing value is the sensing value for the B channel component of the light which results from the image output from the display 760 with light blocked off from the outside, and the C channel sensing value is the sensing value for the visible light band component of the light which results from the image output from the display 760.

According to an embodiment, the illuminance raw data may include an illuminance value calculated based on the R channel sensing value, G channel sensing value, B channel sensing value, and C channel sensing value which are obtained as the illuminance sensor senses the light resulting from the image output on the display 760 based on the R, G, and B values, with light blocked off from the outside.

According to an embodiment, the processor 720 may obtain correction information associated with the display parameter information using the illuminance raw data. For example, the correction information may be information where the illuminance value by the influence of the display may be excluded from the first illuminance data. The processor 720 may obtain the second illuminance data based on the first illuminance data and the correction information. For example, the processor 720 may obtain the second illuminance data which results from excluding the illuminance value by the influence of the display from the first illuminance data using the correction information.

According to an embodiment, the memory 730 may store instructions to, when executed, enable the processor 720 to receive the first illuminance data measured using the illuminance sensor 776, identify display parameter information associated with the first illuminance data, obtain the second illuminance data based on the display parameter information and the first illuminance data, and adjust the brightness of the display based on the second illuminance data. For example, the memory 730 may store instructions to, when executed, enable the processor 720 to receive, from the illuminance sensor, an amount of light measured during a first time period by the illuminance sensor 776 while the display is operated, calculate a first illuminance value based on at least a part of the received amount of light, identify parameter information related to the at least one pixel of the display 760 during the first period or at a time of termination of the first period, determine a second illuminance value based on at least a part of the identified parameter information and the calculated first illuminance value, and adjust a brightness of the display based on at least a part of the determined second illuminance value.

According to an embodiment, the display 760 may include the display driver IC 762 (e.g., the DDI 230 of FIG. 2) and a display panel 764.

According to an embodiment, the display driver IC 762 may perform control to output image information through the display panel 764. According to an embodiment, the display driver IC 762 may perform control to output image information on a per-image frame basis and may provide color information, e.g., COPR information, about the image output per frame. According to an embodiment, the COPR information may represent the ration of the R, G, and B values of the output image. For example, the R value may denote a red value within a range from 0 to 255, the G value may denote a green value within a range from 0 to 255, and the B value may denote a blue value within a range from 0 to 255. For example, COPR information about a white screen may have the value of (R, G, B: 255, 255, 255).

According to an embodiment, the display panel 764 may include a plurality of pixels including red (R) subpixels, green (G) subpixels, and blue (B) subpixels. As data and current are provided to each of the plurality of pixels under the control of the display driver IC 762, the display panel 764 may output an image in a combination of the colors of the subpixels of the pixels.

According to an embodiment, the illuminance sensor 776 may be an ambient light sensor. The illuminance sensor 776 may sense ambient light and output illuminance data. According to an embodiment, the illuminance sensor 776 may provide the first illuminance data measured during a designated time (e.g., 50 ms) and may provide an interrupt signal along with the first illuminance data.

According to an embodiment, the illuminance sensor 776 may include a plurality of channels for sensing ambient light. According to an embodiment, the plurality of channels may include channels for receiving light of a visible light band or channels for receiving light of a band (e.g., an infrared (IR) band or ultraviolet (UV) band) other than the visible light band. For example, the plurality of channels may include a first channel, a second channel, a third channel, and a fourth channel 776-1, 776-2, 776-3, and 776-4. According to an embodiment, the plurality of channels may further include other channels than the first to fourth channels 776-1 to 776-4 or may not include some of the first to fourth channels 776-1 to 776-4. For example, the first channel 776-1, the second channel 776-2, the third channel 776-3, and the fourth channel 776-4 may be a red (R) channel, a green (G) channel, a blue (B) channel, and a clear (C) channel, respectively. According to an embodiment, the R channel may receive light of a wavelength band ranging from 550 nm to 700 nm, centering around 650 nm. The G channel may receive light of a wavelength band ranging from 450 nm to 650 nm, centering around 550 nm. The B channel may receive light of a wavelength band ranging from 400 nm to 550 nm, centering around 450 nm. The C channel may receive light (e.g., visible light band of light) of a wavelength band ranging from 400 nm to 750 nm. According to an embodiment, the light-receivable wavelength band of each channel may be designated to differ from above. The illuminance sensor 776 may receive light of each designated band using the plurality of channels for a designated time and combine the bands of light, thereby outputting the first illuminance data sensed for the external light.

According to an embodiment, an electronic device (e.g., the electronic device 101 of FIG. 1, the electronic device 300 of FIGS. 3A to 3C, the electronic device 400 of FIG. 4, the electronic device 500 of FIG. 5, or the electronic device 700 of FIG. 7) comprises a housing (e.g., the housing 310 of FIG. 3A) including a front surface (e.g., the front surface 310A of FIG. 3A) and a rear surface (e.g., the rear surface 310B of FIG. 3B) facing away from the front surface, a display (e.g., the display device 160 of FIGS. 1 and 2, the display 301 of FIG. 3A, the display 401 of FIG. 4, the display 501 of FIG. 5, or the display 760 of FIG. 7) included in the housing and exposed through a portion of the front surface, an illuminance sensor (e.g., the sensor module 176 of FIG. 1, a sensor module 276 of FIG. 2, the illuminance sensor 320 of FIG. 3A, the illuminance sensor 420 of FIG. 4, the illuminance sensor 520 of FIG. 5, or the sensor module 776 of FIG. 7) disposed between the display and the rear surface to overlap an area of the display when viewed from above the front surface, a processor (e.g., the processor 120 of FIG. 1 or the processor 720 of FIG. 7) positioned inside the housing and operatively connected with the display, and a memory (e.g., the memory 130 of FIG. 1 or the memory 730 of FIG. 7) positioned inside the housing and operatively connected with the processor, wherein the memory stores instructions configured to, when executed, enable the processor to receive first illuminance data measured using the illuminance sensor, identify display parameter information associated with the first illuminance data, obtain second illuminance data based on at least a part of the display parameter information and the first illuminance data, and adjust a brightness of the display based on at least a part of the second illuminance data.

According to an embodiment, the display parameter information may include information associated with at least one of a color, a brightness, or a transmittance of the display.

According to an embodiment, the display parameter information may include COPR information about an image output through the display and/or AOR information about the display.

According to an embodiment, the illuminance sensor may be disposed under at least an area of the display. The display parameter information may be COPR information about an image output from at least the area of the display.

According to an embodiment, the instructions may be configured to measure the first illuminance data at each designated first time interval using the illuminance sensor, receive, from the illuminance sensor, the measured first illuminance data while an interrupt occurs at the time of termination of measurement of the first illuminance data, and identify COPR information about an image output from at least an area of the display.

According to an embodiment, the instructions may be configured to enable the processor to identify COPR information about an image frame output from the display when the interrupt occurs.

According to an embodiment, the instructions may be configured to enable the processor to obtain illuminance raw data, with light blocked off from an outside, obtain correction information associated with the display parameter information using the obtained illuminance raw data, and obtain the second illuminance data using the obtained correction information and the received first illuminance data.

According to an embodiment, the illuminance raw data may include an R channel sensing value, a G channel sensing value, a B channel sensing value, and a C channel sensing value of the illuminance sensor, corresponding to an R value, a G value, a B value, and a C value, respectively, of an image output from the display, with the light blocked off from the outside.

According to an embodiment, the illuminance raw data may include an illuminance value calculated based on at least a part of an R channel sensing value, a G channel sensing value, a B channel sensing value, and a C channel sensing value of the illuminance sensor, corresponding to an R value, a G value, a B value, and a C value, respectively, of an image output from the display, with the light blocked off from the outside.

According to an embodiment, an electronic device (e.g., the electronic device 101 of FIG. 1, the electronic device 300 of FIGS. 3A to 3C, the electronic device 400 of FIG. 4, the electronic device 500 of FIG. 5, or the electronic device 700 of FIG. 7) comprises a housing (e.g., the housing 310 of FIG. 3A) including a first plate (e.g., the front surface 310A of FIG. 3A) and a rear plate (e.g., the rear surface 310B of FIG. 3B) facing away from the first plate, a touchscreen display (e.g., the display device 160 of FIGS. 1 and 2, the display 301 of FIG. 3A, the display 401 of FIG. 4, the display 501 of FIG. 5, or the display 760 of FIG. 7) included in the housing, viewed through a portion of the first plate, and including at least one pixel, an illuminance sensor (e.g., the sensor module 176 of FIG. 1, the sensor module 276 of FIG. 2, the illuminance sensor 320 of FIG. 3A, the illuminance sensor 420 of FIG. 4, the illuminance sensor 520 of FIG. 5, or the sensor module 776 of FIG. 7) disposed between the display and the rear plate to overlap at least one pixel of the display when viewed from above the first plate, a processor (e.g., the processor 120 of FIG. 1 or the processor 720 of FIG. 7) positioned inside the housing and operatively connected with the display and the illuminance sensor, and a memory (e.g., the memory 130 of FIG. 1 or the memory 730 of FIG. 7) positioned inside the housing and operatively connected with the processor, wherein the memory stores instructions configured to, when executed, enable the processor to receive, from the illuminance sensor, an amount of light measured during a first time period by the illuminance sensor while the display is operated, calculate a first illuminance value based on at least a part of the received amount of light, identify parameter information related to the at least one pixel of the display during the first period or at a time of termination of the first period, determine a second illuminance value based on at least a part of the identified parameter information and the calculated first illuminance value, and adjust a brightness of the display based on at least a part of the determined second illuminance value.

According to an embodiment, the illuminance sensor may be disposed under at least an area of the display.

According to an embodiment, the parameter information may include COPR information about an image output through at least an area of the display and/or AOR information.

Figure 8:
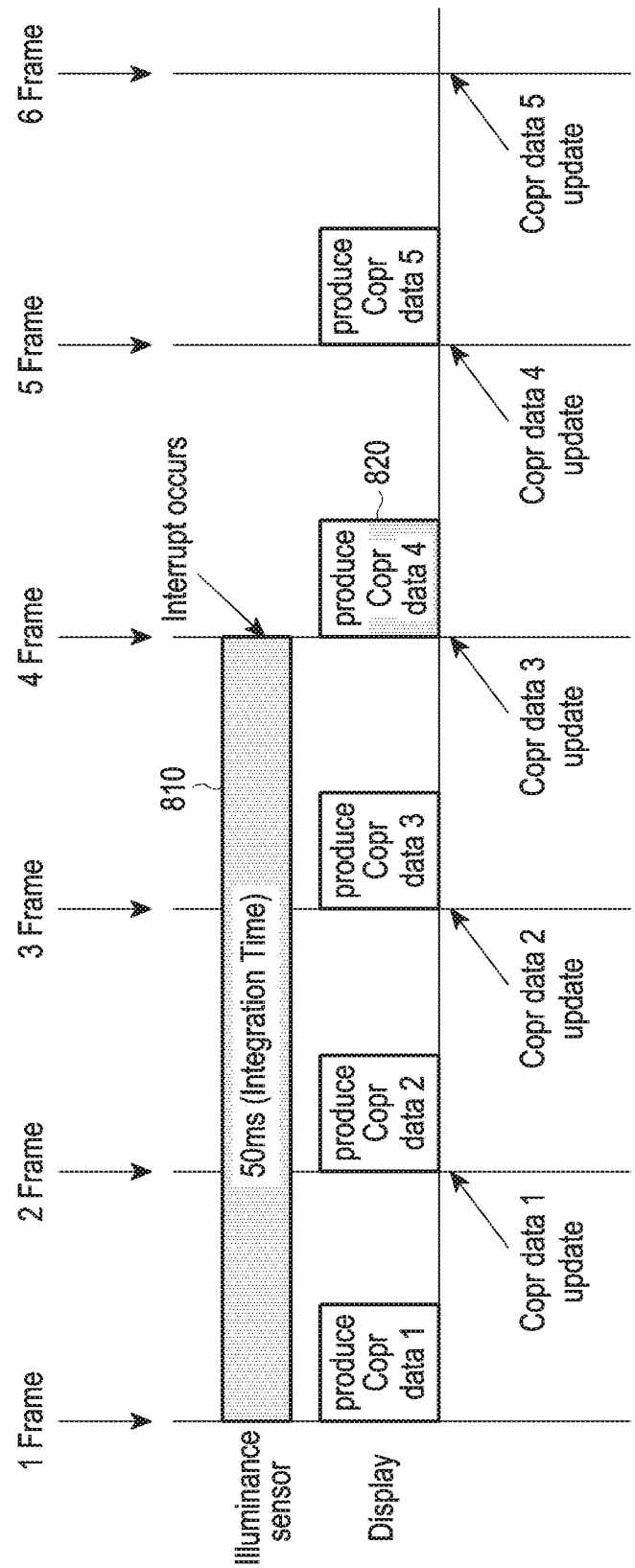
FIG. 8 is a view illustrating color on pixel ratio (COPR) information about an image output from a display and first illuminance data measured using an illuminance sensor according to an embodiment of the disclosure.

FIG. 8 is a view illustrating COPR information about an image output from a display and first illuminance data measured using an illuminance sensor according to an embodiment of the disclosure.

Referring to FIG. 8, according to an embodiment, an illuminance sensor (e.g., the illuminance sensor 776 of FIG. 7) may provide first illuminance data based on the amount of light measured at a first time period or during a designated time (e.g., 50 ms) and produce an interrupt signal at the time of providing the first illuminance data. According to an embodiment, a display (e.g., the display 760 of FIG. 7) may output one frame of image per designated time (e.g., 16.6 ms) 810 on a per-image frame basis and produce COPR data corresponding to the image frame in each image frame.

According to an embodiment, the COPR data may represent the ratio of the R, G, and B values of the output image frame. For example, the R value may denote a red value within a range from 0 to 255, the G value may denote a green value within a range from 0 to 255, and the B value may denote a blue value within a range from 0 to 255. For example, COPR information about a white image frame may have the value of (R, G, B: 255, 255, 255).

For example, when a first frame (i.e., 1Frame) is output, the display 760 may produce COPR data 1 corresponding to 1Frame and, when a second frame (i.e., 2Frame) is output, the display 760 may produce COPR data 2 corresponding to 2Frame. The COPR data may be updated whenever the image frame is output and be stored in the memory 730. According to an embodiment, the processor 720 may identify that the display parameter corresponding to the first illuminance data is COPR data 4 (820) based on the interrupt signal produced at the time of providing the first illuminance data. According to an embodiment, the display parameter may be parameter information associated with at least one pixel of the display 760. According to an embodiment, the time of measurement of illuminance data by the illuminance sensor and the period of outputting one frame image may be varied in the electronic device 700.

According to an embodiment, a method of sensing illuminance by an electronic device (e.g., the electronic device 101 of FIG. 1, the electronic device 300 of FIGS. 3A to 3C, the electronic device 400 of FIG. 4, the electronic device 500 of FIG. 5, or the electronic device 700 of FIG. 7) comprises receiving first illuminance data measured using an illuminance sensor (e.g., the sensor module 176 of FIG. 1, the sensor module 276 of FIG. 2, the illuminance sensor 320 of FIG. 3A, the illuminance sensor 420 of FIG. 4, the illuminance sensor 520 of FIG. 5, or the sensor module 776 of FIG. 7), identifying display parameter information associated with the first illuminance data, obtaining second illuminance data based on at least a part of the display parameter information and the first illuminance data, and adjusting a brightness of the display (e.g., the display device of FIGS. 1 and 2 or the display 760 of FIG. 7) based on at least a part of the second illuminance data.

According to an embodiment, the display parameter information may include information associated with at least one of a color, a brightness, or a transmittance of the display.

According to an embodiment, the display parameter information may include COPR information about an image output through the display.

According to an embodiment, the display parameter information may further include AOR information about the display.

According to an embodiment, the display parameter information may be COPR information about an image output from at least an area of the display of the electronic device.

According to an embodiment, the method may further comprise receiving an interrupt which occurs at a time of termination of the illuminance measurement and illuminance data measured at each designated first time interval from the illuminance sensor, receiving, from the display, COPR information per frame, and identifying COPR information about an image frame output from the display when the interrupt is received.

According to an embodiment, the method may further comprise obtaining illuminance raw data, with light blocked off from an outside and obtaining correction information associated with the display parameter information using the illuminance raw data, wherein second illuminance data is obtained using the obtained correction information and the received first illuminance data.

According to an embodiment, the illuminance raw data may include an R channel sensing value, a G channel sensing value, a B channel sensing value, and a C channel sensing value of the illuminance sensor, corresponding to an R value, a G value, a B value, and a C value, respectively, of an image output from the display, with the light blocked off from the outside.

According to an embodiment, the illuminance raw data may include illuminance data obtained based on an R channel sensing value, a G channel sensing value, a B channel sensing value, and a C channel sensing value of the illuminance sensor, corresponding to an R value, a G value, a B value, and a C value, respectively, of an image output from the display, with the light blocked off from the outside.

Figure 9:
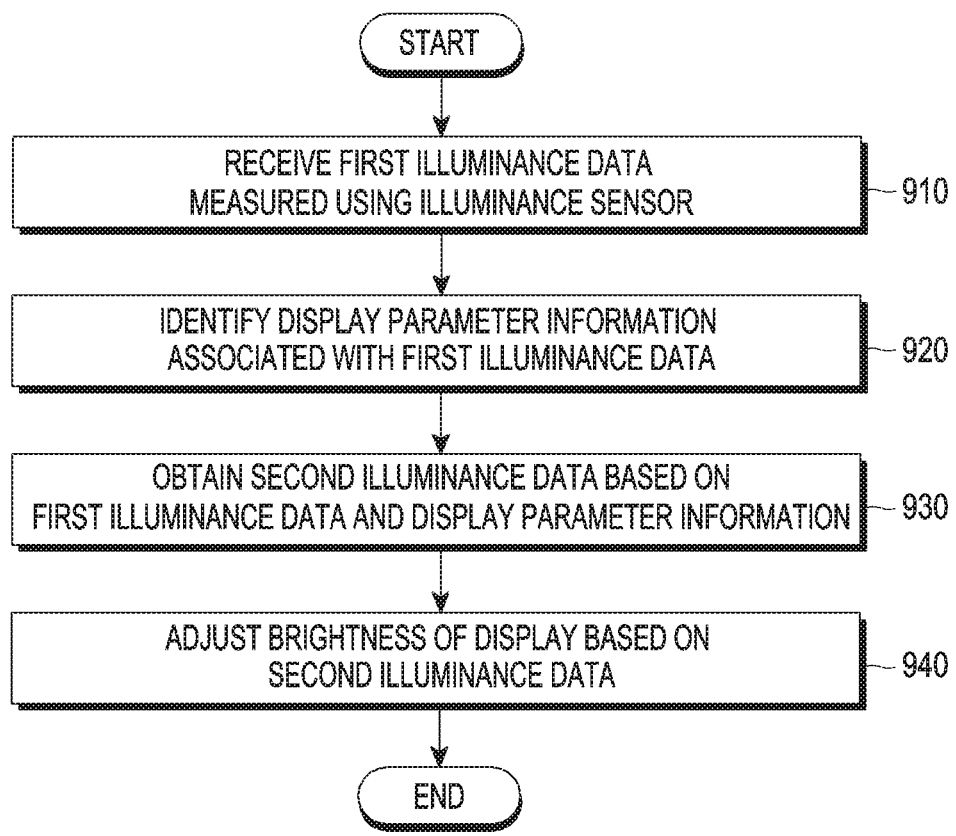
FIG. 9 is a flowchart illustrating an illuminance sensing method based on display parameter information in an electronic device according to an embodiment of the disclosure.

FIG. 9 is a flowchart illustrating an illuminance sensing method based on display parameter information in an electronic device according to an embodiment of the disclosure.

Referring to FIG. 9, according to an embodiment, operations 910 to 940 may be appreciated as performed by a processor (e.g., the processor 120 of FIG. 1 or the processor 720 of FIG. 7, hereinafter, the processor 720 of FIG. 7 is described as an example) of an electronic device (e.g., the electronic device 101 of FIG. 1, the electronic device 300 of FIGS. 3A to 3C, the electronic device 400 of FIG. 4, the electronic device 500 of FIG. 5, or the electronic device 700 of FIG. 7). According to an embodiment, at least one of operations 910 to 940 may be omitted or changed in order or may add other operations.

According to an embodiment, in operation 910, the processor 720 may receive first illuminance data measured using an illuminance sensor (e.g., the sensor module 176 of FIG. 1, the sensor module 276 of FIG. 2, the illuminance sensor 320 of FIG. 3A, the illuminance sensor 420 of FIG. 4, the illuminance sensor 520 of FIG. 5, or the illuminance sensor 776 of FIG. 7). According to an embodiment, the processor 720 may receive first illuminance data (e.g., a first illuminance value) based on the amount of light measured during a first time period from the illuminance sensor 776. For example, the first illuminance data may be an illuminance value or illuminance data which has not been excluded from influence by a display (e.g., the display device 160 of FIGS. 1 and 2, the display 301 of FIG. 3A, the display 401 of FIG. 4, the display 501 of FIG. 5, or the display 760 of FIG. 7, hereinafter, the display 760 of FIG. 7 is described as an example).

According to an embodiment, in operation 920, the processor 720 may identify display parameter information associated with the first illuminance data. According to an embodiment, the display parameter information associated with the first illuminance data may be identified as parameter information related to at least one pixel of the display 760 at the time of complete measurement of the first illuminance data, during a first period, or at the time of termination of the first period. For example, the parameter information related to the at least one pixel of the display 760 may include information associated with at least one of the color, the brightness, or the transmittance of the display 760. According to an embodiment, the display parameter information associated with the first illuminance data may be COPR information associated with an image output from the display 760 at the time of measurement of the first illuminance data, during the first period, or at the time of termination of the first period. For example, the COPR information may be a ratio of the R, G, and B values of the image output from the display 760. According to an embodiment, the display parameter information associated with the first illuminance data may include AOR information associated with the display 760 at the time of measurement of the first illuminance data.

According to an embodiment, in operation 930, the processor 720 may obtain second illuminance data (e.g., a second illuminance value) based on the display parameter information and the second illuminance data. According to an embodiment, the processor 720 may obtain illuminance raw data based on the illuminance value measured by the illuminance sensor 776 when the display 760 outputs an image with external light blocked off. For example, the processor 720 may obtain correction information for the first illuminance data using the illuminance raw data and apply the correction information to the first illuminance data, thereby obtaining second illuminance data where the illuminance value by the influence of the display 760 has been excluded from the first illuminance data.

According to an embodiment, in operation 940, the processor 720 may adjust the brightness of the display 760 based on the second illuminance data. For example, the processor 720 may determine the actual ambient brightness (e.g., the brightness corresponding to the second illuminance value or the second illuminance data), which has not been affected by the display 760, based on the second illuminance data which has been excluded from influence of the display 760 and adjust the brightness of the display 760 to the actual ambient brightness. According to the prior art, the ambient brightness may be determined to be high even in the darkness due to influence of the display 760 and, thus, the user's eyes may feel tired due to the high brightness of the display 760. However, according to an embodiment of the disclosure, the brightness of the display 760 may be adjusted based on the actual ambient brightness with the influence of the display 760 excluded, and this may relieve eye fatigue.

Figure 10:
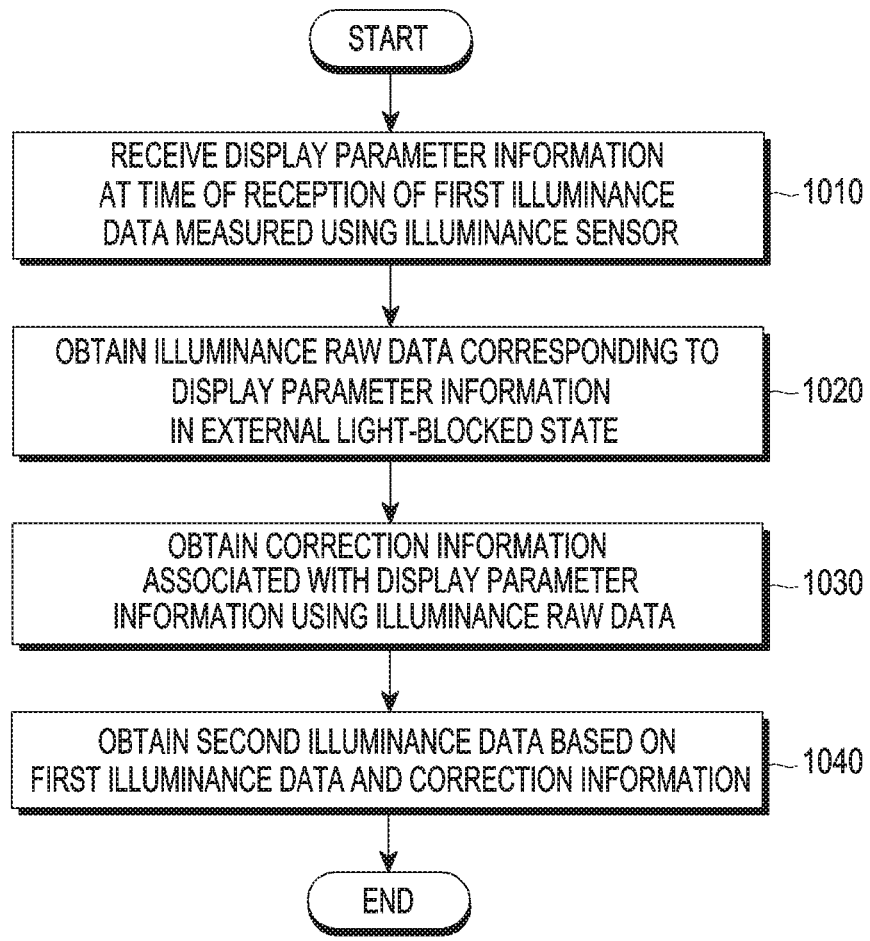
FIG. 10 is a flowchart illustrating a method of correcting illuminance data in an electronic device according to an embodiment of the disclosure.

FIG. 10 is a flowchart illustrating a method of correcting illuminance data in an electronic device according to an embodiment of the disclosure.

Referring to FIG. 10, according to an embodiment, operations 1010 to 1040 may be appreciated as performed by a processor (e.g., the processor 120 of FIG. 1 or the processor 720 of FIG. 7, hereinafter, the processor 720 of FIG. 7 is described as an example) of an electronic device (e.g., the electronic device 101 of FIG. 1, the electronic device 300 of FIGS. 3A to 3C, the electronic device 400 of FIG. 4, the electronic device 500 of FIG. 5, or the electronic device 700 of FIG. 7). According to an embodiment, at least one of operations 1010 to 1040 may be omitted or changed in order or may add other operations.

According to an embodiment, in operation 1010, the processor 720 may identify the display parameter information associated with the first illuminance data at the time of receiving the first illuminance data measured using an illuminance sensor (e.g., the sensor module 176 of FIG. 1, the sensor module 276 of FIG. 2, the illuminance sensor 320 of FIG. 3A, the illuminance sensor 420 of FIG. 4, the illuminance sensor 520 of FIG. 5, or the illuminance sensor 776 of FIG. 7). According to an embodiment, the display parameter information associated with the first illuminance data may include information associated with at least one of the color, the brightness, or the transmittance of a display (e.g., the display device 160 of FIGS. 1 and 2, the display 301 of FIG. 3A, the display 401 of FIG. 4, the display 501 of FIG. 5, or the display 760 of FIG. 7, hereinafter, the display 760 of FIG. 7 is described as an example) at the time of complete measurement of the first illuminance data. According to an embodiment, the display parameter information associated with the first illuminance data may include COPR information associated with the image output from the display 760 at the time of measurement of the first illuminance data. For example, the COPR information may be a ratio of the R, G, and B values of the image output from the display 760. According to an embodiment, the display parameter information associated with the first illuminance data may include AOR information associated with the display 760 at the time of measurement of the first illuminance data.

According to an embodiment, in operation 1020, the processor 720 may obtain illuminance raw data corresponding to the display parameter information with external light blocked off. According to an embodiment, the processor 720 may obtain illuminance raw data based on the illuminance value measured by the illuminance sensor 776 when the display 760 outputs an image with external light blocked off. According to an embodiment, the illuminance raw data may be a value obtained as the illuminance sensor senses the light which results from the image which the display 760 outputs based on the R, G, and B values, with light blocked off from the outside. For example, the illuminance sensor may sense the light, which results from the image output from the display 760 with light blocked off from the outside, using the R, G, B, and C channels, thereby obtaining an R channel sensing value, a G channel sensing value, a B channel sensing value, and a C channel sensing value. The R channel sensing value may be the sensing value for the R channel component of the light which results from the image output from the display 760 with light blocked off from the outside, the G channel sensing value may be the sensing value for the G channel component of the light which results from the image output from the display 760 with light blocked off from the outside, the B channel sensing value is the sensing value for the B channel component of the light which results from the image output from the display 760 with light blocked off from the outside, and the C channel sensing value is the sensing value for the visible light band component of the light which results from the image output from the display 760.

According to an embodiment, the illuminance raw data may include an illuminance value calculated based on the R channel sensing value, G channel sensing value, B channel sensing value, and C channel sensing value which are obtained as the illuminance sensor senses the light resulting from the image output on the display 760 based on the R, G, and B values, with light blocked off from the outside.

According to an embodiment, in operation 1030, the processor 720 may obtain correction information associated with the display parameter information using the illuminance raw data.

According to an embodiment, the processor 720 may obtain first correction information or second correction information.

According to an embodiment, the first correction information may be the illuminance value corresponding to each of the R, G, and B values which are 1, that is, as the illuminance value sensed by the illuminance sensor 776 when each of the R, G, and B values included in the display parameter information is 1 with external light blocked off. For example, the first correction information may include the illuminance value when the R value is 1 with external light blocked off, the illuminance value when the G value is 1 with external light blocked off, or the illuminance value when the B value is 1 with external light blocked off, (e.g., the R channel sensing value when the R value is 1, the G channel sensing value when the G value is 1, or the B channel sensing value when the B value is 1).

According to an embodiment, the second correction information may include information about the relationship (e.g., a mathematical equation or formula) between the R, G, and B values of each of the plurality of images included in the display parameter information, with external light blocked off, and the illuminance value measured at the time of outputting each of the plurality of images.

According to an embodiment, in operation 1040, the processor 720 may obtain second illuminance data based on the first illuminance data and the correction information. According to an embodiment, the processor 720 may obtain the second illuminance data, which is the ambient brightness not influenced by the display 760, by excluding the illuminance value according to the first correction information from the illuminance value according to the first illuminance data. According to an embodiment, the processor 720 may obtain the second illuminance data, which is the ambient brightness not influenced by the display 760, by inputting the first illuminance data in the equation according to the second correction information to thereby obtain the illuminance value (e.g., COPR illuminance value) by the influence of the display 760 with external light blocked off and excluding (deducting) the COPR illuminance value from the first illuminance data.

According to an embodiment, the electronic device (e.g., the electronic device 101 of FIG. 1, the electronic device 300 of FIGS. 3A to 3C, the electronic device 400 of FIG. 4, the electronic device 500 of FIG. 5, or the electronic device 700 of FIG. 7) may store, in a memory (e.g., the memory 130 of FIG. 1 or the memory 730 of FIG. 7), a table representing illuminance raw data which corresponds to display parameter information (e.g., COPR information) with external light blocked off (zero lux).

Table 1 below is an example table that represents illuminance raw data corresponding to display parameter information (e.g., COPR information) in the external light-blocked state.

TABLE 1

| Image | display parameter information | | | illuminance raw data | | | | |
|---|---|---|---|---|---|---|---|---|
| | R | G | B | R | G | B | C | LUX |
| first image (BLUE) | 0 | 0 | 253 | 1 | 15 | 30 | 20 | 1.9 |
| second image (GREEN) | 0 | 254 | 0 | 39 | 138 | 42 | 88 | 33.5 |
| third image (RED) | 238 | 0 | 0 | 83 | 4 | 1 | 40 | 1.9 |

Referring to Table 1, the processor 720 may obtain the illuminance raw data corresponding to the display parameter information in the external light-blocked state from the memory 730. For example, the processor 720 may obtain an R channel sensing value of 1, a G channel sensing value of 15, a B channel sensing value of 30, a C channel sensing value of 20, and a illuminance value (LUX) of 1.9 which are measured when the B value is 253 in the external light-blocked state (zero lux), an R channel sensing value of 39, a G channel sensing value of 138, a B channel sensing value of 42, a C channel sensing value of 88, and a illuminance value (LUX) of 33.5 which are measured when the G value is 254 in the external light-blocked state (zero lux), and an R channel sensing value of 83, a G channel sensing value of 4, a B channel sensing value of 1, a C channel sensing value of 40, and a illuminance value (LUX) of 1.9 which are measured when the R value is 238 in the external light-blocked state (zero lux).

Table 2 below may be an example table that represents correction information (e.g., the first correction information) obtained by reflecting a designated brightness (e.g., 70 cd) to the display parameter information (e.g., COPR information) in the external light-blocked state and dividing the illuminance raw data by the brightness-reflected display parameter information.

TABLE 2

| display parameter information | | | brightness-reflected display parameter information | | | correction information | | | |
|---|---|---|---|---|---|---|---|---|---|
| R | G | B | R | G | B | R | G | B | C |
| 0 | 0 | 253 | 0 | 0 | 70 | 0.014 | 0.214 | 0.429 | 0.286 |
| 0 | 254 | 0 | 0 | 70.84 | 0 | 0.549 | 1.944 | 0.592 | 1.239 |
| 238 | 0 | 0 | 61.04 | 0 | 0 | 0.066 | 0.066 | 0.016 | 0.656 |

Referring to Table 2, the processor 720 may obtain the correction information (e.g., the first correction information), e.g., the COPR coefficient for each of the B, G, and R values of 1, by reflecting a designated brightness (e.g., 70 cd) to the display parameter information (e.g., COPR information) in the external light-blocked state and dividing the illuminance raw data by the brightness-reflected display parameter information. For example, the processor 720 may obtain the first COPR coefficient (R, G, B, C: 0.014, 0.214, 0.429, 0.286) for the B value of 1 by dividing the R value (which is 1) of the illuminance raw data by the brightness-reflected B value (which is 70), the G value (which is 15) of the illuminance raw data by the brightness-reflected B value (which is 70), the B value (which is 30) of the illuminance raw data by the brightness-reflected B value (which is 70), and the C value (which is 20) of the illuminance raw data by the brightness-reflected B value (which is 70). The second and third COPR coefficients for the G and R values of 1 may also be obtained in the same manner applied for the B value. For example, the first correction information may be the COPR coefficient for each of the R, G, and B values.

Table 3 below may be an example table for describing a method of obtaining second illuminance data, which is the ambient brightness not influenced by the display 760 by obtaining the current brightness to the correction information-reflected first illuminance data to thereby obtain the illuminance value (COPR illuminance value) by the influence of the display (COPR of the display) and excluding (deducting) the COPR illuminance value from the first illuminance data.

TABLE 3

| Image | correction information-applied first illuminance data | | | | brightness-reflected first illuminance data | | | | second illuminance data | | | | |
|---|---|---|---|---|---|---|---|---|---|---|---|---|---|
| | R | G | B | C | R | G | B | C | R | G | B | C | LUX |
| first image (BLUE) | 4 | 54 | 107 | 72 | 1 | 15 | 30 | 20 | 0 | 0 | 0 | 0 | 0 |
| second image (GREEN) | 139 | 491 | 149 | 313 | 39 | 138 | 42 | 88 | 0 | 0 | 0 | 0 | −0.5 |
| third image (RED) | 296 | 14 | 4 | 143 | 83 | 4 | 1 | 40 | 0 | 0 | 0 | 0 | 0 |

Referring to Table 3, the processor 720 may obtain the illuminance value (COPR illuminance value) by the influence (COPR of the display) of the display by reflecting (multiplying) the first correction information to the first illuminance data measured using the illuminance sensor 776 and reflecting the current brightness (e.g., 0.28) to the first correction information-reflected first illuminance data, and the processor 720 may obtain the second illuminance data, which is the ambient brightness not influenced by the display by excluding (deducting) the COPR illuminance value from the first illuminance data.

According to an embodiment, the processor 720 of the electronic device (e.g., the electronic device 101 of FIG. 1, the electronic device 300 of FIGS. 3A to 3C, the electronic device 400 of FIG. 4, the electronic device 500 of FIG. 5, or the electronic device 700 of FIG. 7) may correct the first illuminance data using the second correction information.

Table 4 may be an example table that represents the R, G, and B values of each of a plurality of images output with external light blocked off to obtain the second correction information and illuminance raw data measured at the time of outputting each of the plurality of images.

TABLE 4

| Image | display parameter information | | | illuminance raw data | | | | |
|---|---|---|---|---|---|---|---|---|
|  | R | G | B | R | G | B | C | LUX |
| first image | 0 | 0 | 0 | 0 | 0 | 0 | 0 | 0 |
| second image | 0 | 0 | 85 | 6 | 12 | 30 | 43 | 1 |
| third image | 0 | 0 | 170 | 21 | 50 | 138 | 187 | 4 |
| fourth image | 0 | 0 | 255 | 53 | 133 | 373 | 501 | 11 |
| fifth image | 0 | 85 | 0 | 49 | 116 | 37 | 187 | 13 |
| sixth image | 0 | 85 | 85 | 60 | 135 | 68 | 242 | 14 |
| seventh image | 0 | 85 | 170 | 74 | 171 | 173 | 381 | 17 |
| eighth image | 0 | 85 | 255 | 104 | 246 | 405 | 682 | 23 |
| ninth image | 0 | 170 | 0 | 173 | 489 | 157 | 758 | 62 |
| tenth image | 0 | 170 | 85 | 183 | 505 | 186 | 807 | 62 |
| eleventh image | 0 | 170 | 170 | 193 | 525 | 283 | 922 | 63 |
| twelfth image | 0 | 170 | 255 | 212 | 572 | 498 | 1170 | 65 |
| thirteenth image | 0 | 255 | 0 | 454 | 1351 | 437 | 2076 | 173 |
| fourteenth image | 0 | 255 | 85 | 460 | 1351 | 460 | 2103 | 172 |
| fifteenth image | 0 | 255 | 170 | 456 | 1332 | 538 | 2149 | 167 |
| sixteenth image | 0 | 255 | 255 | 450 | 1295 | 711 | 2262 | 158 |
| ... | ... | ... | ... | ... | ... | ... | ... | ... |
| sixty fourth image | 255 | 255 | 255 | 255 | 255 | 255 | 255 | 255 |

Referring to Table 4, the processor 720 of the electronic device (e.g., the electronic device 101 of FIG. 1, the electronic device 300 of FIGS. 3A to 3C, the electronic device 400 of FIG. 4, the electronic device 500 of FIG. 5, or the electronic device 700 of FIG. 7) may obtain the R, G, and B values of each of a plurality of images output with external light blocked off and illuminance raw data measured at the time of outputting each of the plurality of images. For example, the processor 720 may obtain the R, G, and B values of each of 4*4 (e.g., (1, 85, 170, 255)*(1, 85, 170, 255))=64 images, each of which has different R, G, and B values from the others, 64 illuminance raw data pieces each of which has been measured at the time of outputting a respective one of the 64 images, and a reference illuminance value (ref LUX) corresponding to the 64 illuminance raw data pieces. According to an embodiment, Equation 1 for obtaining the reference illuminance value (ref LUX) corresponding to the illuminance raw data may be as follows.

$$\text{refLUX} = (DGF*(R*\text{coef} + G*\text{coef} + B*\text{coef} + C*\text{coef}))/(A\text{time}/A\text{gain}) \quad \text{Equation 1}$$

In Equation 1 above, the R, G, B, and C values may be the illuminance raw data, DGF may be the constant, coef may be the coefficient, Atime may be the illuminance measurement time, and Again may be the sensitivity of the illuminance sensor. The R, G, B, and C values may be multiplied by the same or different at least one coef.

The processor 720 may calculate the illuminance value (W) corresponding to each of the R, G, and B values in the external light-blocked state using the reference illuminance value (ref LUX) corresponding to each of the R, G, and B values of each of the plurality of images. For example, Equation 2 for calculating the illuminance value W1 (e.g., COPR illuminance value) by the influence of the R, G, and B values with external light blocked off may be as follows.

$$\text{COPR illuminance value}(W1) = Cr*R^{2.2} + Cg*G^{2.2} + Cb*B^{2.2} \quad \text{Equation 2}$$

In Equation 2 above, Cr, Cg, and Cb may be the coefficients, and each of the R, G, and B values, raised to the power of 2.2 may reflect the point that increases exponentially as the R, G, or B value increases.

The processor 720 may calculate the final COPR illuminance value W2 by reflecting the current brightness, with the COPR illuminance value W1 calculated.

Figure 11:
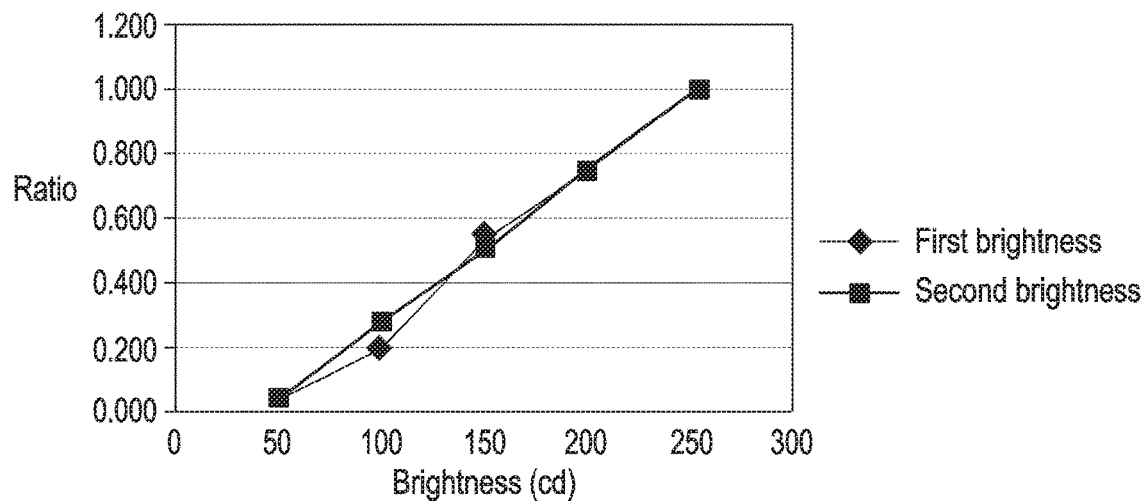
FIG. 11 is a graph illustrating a relationship between brightness and illuminance according to an embodiment of the disclosure.

FIG. 11 is a graph illustrating a relationship between brightness and illuminance according to an embodiment of the disclosure.

Referring to FIG. 11, the horizontal axis may denote the brightness (cd), and the vertical axis may denote the variation rate of the COPR illuminance value W1. When the first brightness changes to the second brightness, the COPR illuminance value W1 may be varied linearly.

Thus, the processor 720 may calculate the final COPR illuminance value W2 using a linear equation, e.g., Equation 3 below, for applying the current brightness with the COPR illuminance value W1 calculated.

$$\text{Final COPR illuminance value}(W2) = \text{Gain } F*W1*(\text{Brightness modeling coefficient}) \quad \text{Equation 3}$$

In Equation 3 above, Gain F may be the compensation coefficient according to the brightness.

The processor 720 may obtain the second illuminance data which is the ambient brightness not influenced by the display 760 by excluding (deducting) the final COPR illuminance value W2 from the first illuminance data measured by the illuminance sensor 776.

Figure 12:
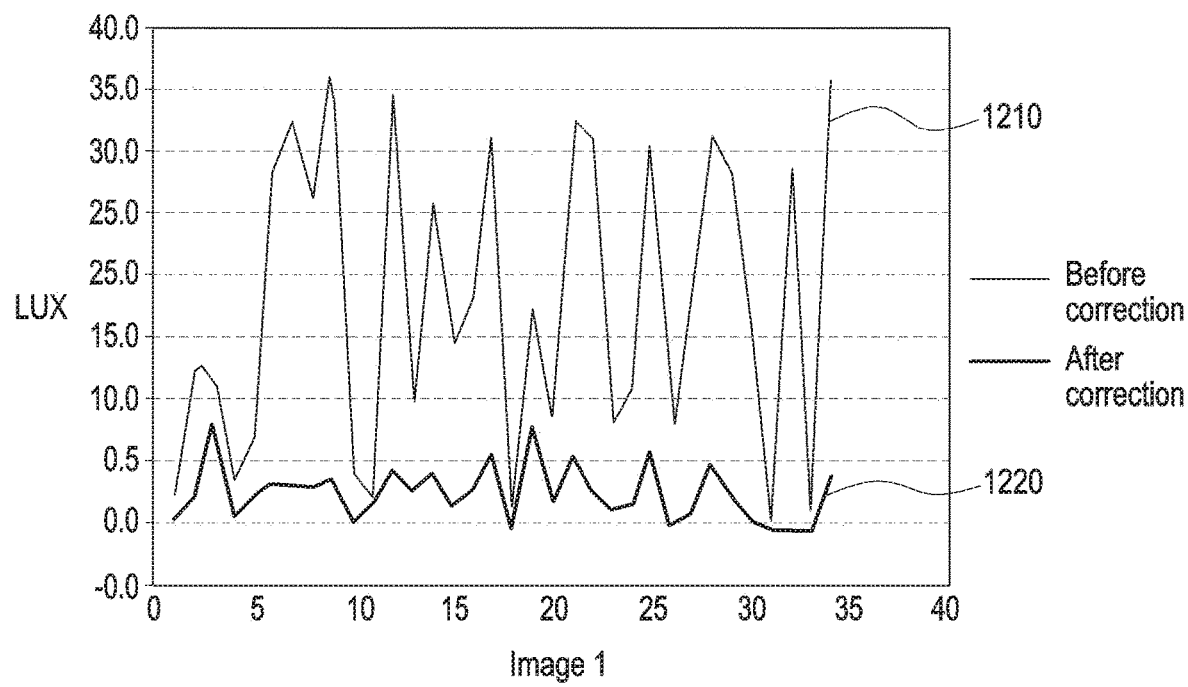
FIGS. 12, 13, and 14 are views illustrating first illuminance data and second illuminance data according to various embodiments of the disclosure.
Figure 13:
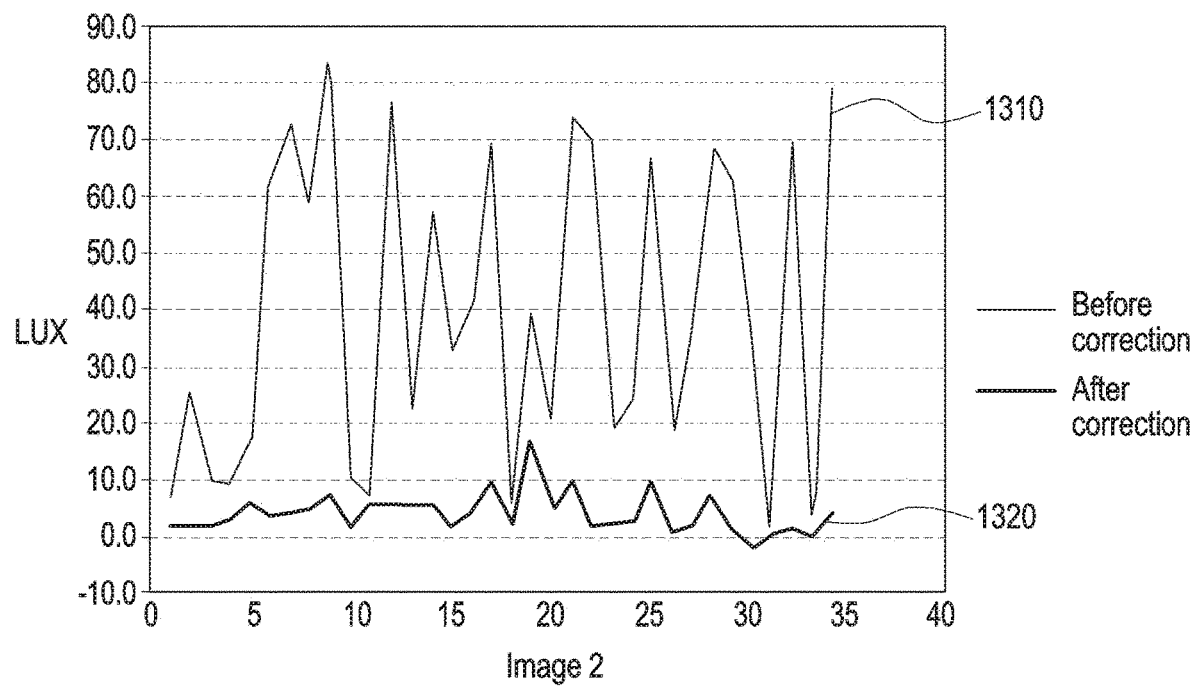
Figure 14:
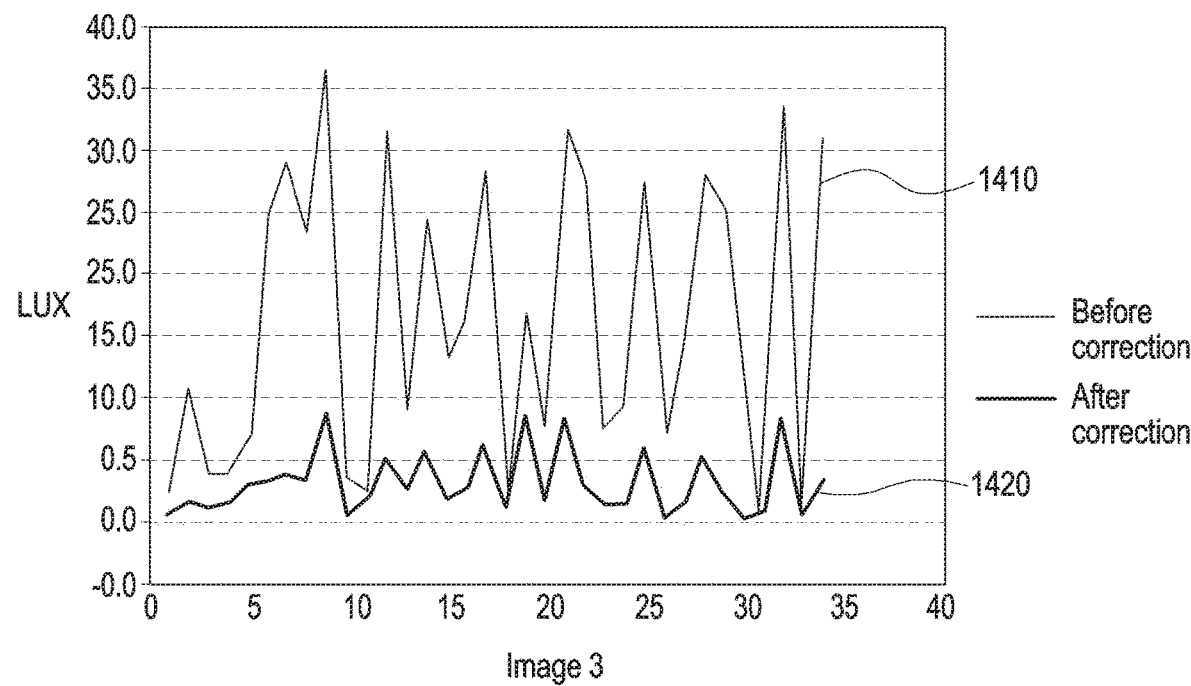

FIGS. 12, 13, and 14 are views illustrating first illuminance data and second illuminance data according to various embodiments of the disclosure.

Referring to FIGS. 12 to 14, according to an embodiment, first illuminance data 1210, 1310, or 1410 and second illuminance data 1220, 1320, or 1420 may be shown for each of images 1, 2, and 3. The first illuminance data 1210, 1310, or 1410 may be illuminance data measured by the illuminance sensor 776 without excluding the illuminance value by the influence of the display in an external light-blocked state (zero lux), and the second illuminance data 1220, 1320, or 1420 may be determined after the illuminance value influenced by the display is excluded from the first illuminance data.

Unless the illuminance value of the display 760 is excluded from illuminance data measured by the illuminance sensor 776, the illuminance sensor 776 may identify that the brightness of external light is measured to be higher than the actual brightness (zero lux) due to the influence of the display 760. It may be identified that excluding the illuminance value by the influence of the display 760 from the illuminance data measured by the illuminance sensor 776 produces a brightness similar to the actual ambient brightness (zero lux).

Figure 15A:
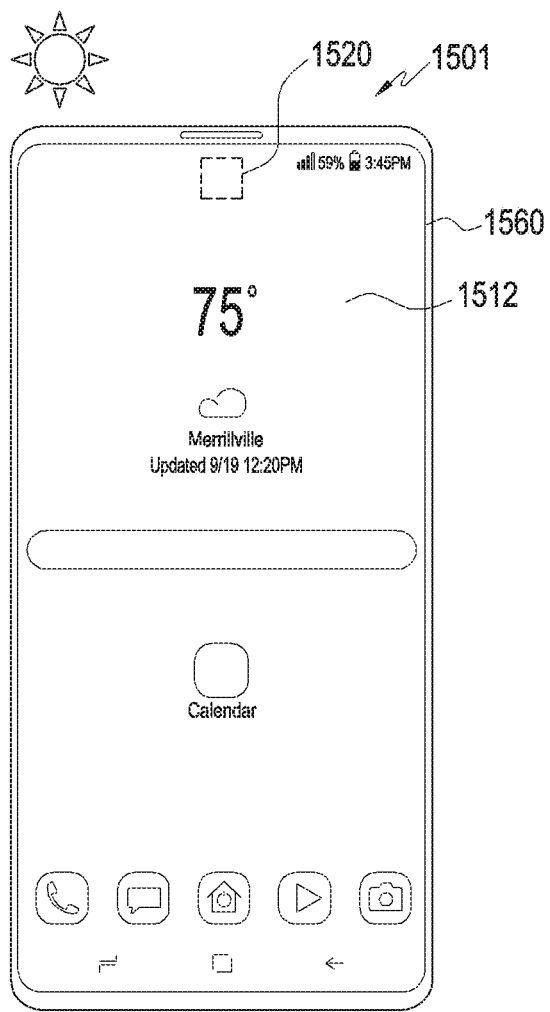
FIGS. 15A and 15B are views illustrating a method of adjusting the brightness of a display using illuminance data in an electronic device according to various embodiments of the disclosure.
Figure 15B:
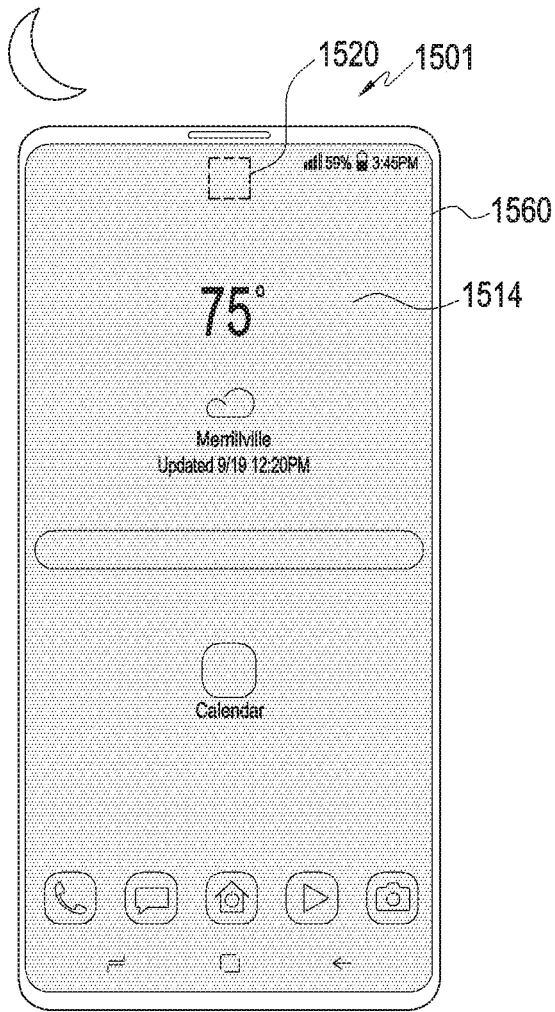

FIGS. 15A and 15B are views illustrating a method of adjusting the brightness of a display using illuminance data in an electronic device according to various embodiments of the disclosure.

Referring to FIGS. 15A and 15B, according to an embodiment, when the external illuminance is higher, e.g., outdoors under strong sunshine as shown in FIG. 15A, an electronic device 1501 (e.g., the electronic device 101 of FIG. 1, the electronic device 300 of FIGS. 3A to 3C, the electronic device 400 of FIG. 4, the electronic device 500 of FIG. 5, or the electronic device 700 of FIG. 7) may increase the brightness of a display 1560 (e.g., the display device 160 of FIGS. 1 and 2, the display 301 of FIG. 3A, the display 401 of FIG. 4, the display 501 of FIG. 5, or the display 760 of FIG. 7) for enhancing visibility and display information more brightly (1512) than a designated brightness.

According to an embodiment, when the external illuminance is low, e.g., at nighttime when sleep is needed as shown in FIG. 15B, the electronic device 1501 may reduce the brightness of the display 1560 to a brightness lower than the designated brightness and display the information more darkly (1514) than the designated brightness. The electronic device 1501 may measure the external light using an illuminance sensor 1520 (e.g., the sensor module 176 of FIG. 1, the sensor module 276 of FIG. 2, the illuminance sensor 320 of FIG. 3A, the illuminance sensor 420 of FIG. 4, the illuminance sensor 520 of FIG. 5, or the illuminance sensor 776 of FIG. 7), thereby determining whether the external illuminance is high or low. According to an embodiment, since the first illuminance data measured using the illuminance sensor 1520 may be influenced by the illuminance value corresponding to display parameter information, the electronic device 1501 may obtain second illuminance data, which results from excluding the illuminance value corresponding to the display parameter information from the first illuminance data, and adjust the brightness of display based on the second illuminance data.

For example, the electronic device 1501 may determine the actual ambient brightness not influenced by the display based on the second illuminance data, which has been excluded from the illuminance value by the influence (e.g., display parameter information) of the display and adjust the brightness of display to the actual ambient brightness. Thus, it may be prevented that the ambient brightness is determined to be high due to the influence of the display in the darkness and, thus, the user's eyes feel tired due to the heightened brightness of the display. According to an embodiment, in the electronic device 1501, the display parameter information may include COPR information. When the proportion of the B value in the COPR information is higher than a designated proportion, the electronic device 1501 may provide information indicating that the user's eyes have been exposed to blue light.

Each of the aforementioned components of the electronic device may include one or more parts, and a name of the part may vary with a type of the electronic device. The electronic device in accordance with various embodiments of the disclosure may include at least one of the aforementioned components, omit some of them, or include other additional component(s). Some of the components may be combined into an entity, but the entity may perform the same functions as the components may do.

The term 'module' may refer to a unit including one of hardware, software, and firmware, or a combination thereof. The term 'module' may be interchangeably used with unit, logic, logical block, component, or circuit. The module may be a minimum unit or part of an integrated component. The module may be a minimum unit or part of performing one or more functions. The module may be implemented mechanically or electronically. For example, the module may include at least one of application specific integrated circuit (ASIC) chips, field programmable gate arrays (FPGAs), or programmable logic arrays (PLAs) that perform some operations, which have already been known or will be developed in the future.

According to an embodiment of the disclosure, at least a part of the device (e.g., modules or their functions) or method (e.g., operations) may be implemented as instructions stored in a computer-readable storage medium e.g., in the form of a program module. The instructions, when executed by a processor (e.g., the processor 120), may enable the processor to carry out a corresponding function. The computer-readable storage medium may be e.g., the memory 130.

According to an embodiment, there is provided a non-transitory storage medium storing instructions configured to be executed by at least one circuit to enable the at least one circuit to perform at least one operation, the at least one operation comprising receiving first illuminance data measured using an illuminance sensor, identifying display parameter information associated with the first illuminance data, obtaining second illuminance data based on at least a part of the display parameter information and the first illuminance data, and adjusting a brightness of the display based on at least a part of the second illuminance data.

The computer-readable storage medium may include a hardware device, such as hard discs, floppy discs, and magnetic tapes (e.g., a magnetic tape), optical media such as compact disc ROMs (CD-ROMs) and digital versatile discs (DVDs), magneto-optical media such as floptical disks, ROMs, RAMs, flash memories, and/or the like. Examples of the program instructions may include not only machine language codes but also high-level language codes which are executable by various computing means using an interpreter. The aforementioned hardware devices may be configured to operate as one or more software modules to carry out various embodiments of the disclosure, and vice versa.

Modules or programming modules in accordance with various embodiments of the disclosure may include at least one or more of the aforementioned components, omit some of them, or further include other additional components. Operations performed by modules, programming modules or other components in accordance with various embodiments of the disclosure may be carried out sequentially, simultaneously, repeatedly, or heuristically. Furthermore, some of the operations may be performed in a different order, or omitted, or include other additional operation(s).

As is apparent from the foregoing description, according to various embodiments, the electronic device may precisely detect external light which has not been influenced by the display. For example, the electronic device may correct the illuminance of light detected under the influence of the display using a parameter associated with an image output from the display, thereby precisely detecting the illuminance of light not influenced by the display.

According to various embodiments, the electronic device may provide the illuminance of light not influenced by the display to various functions for which the external illuminance is used, thereby preventing the functions using the external illuminance from malfunctioning.

According to various embodiments, the electronic device may use the illuminance of light not influenced by the display in adjusting the brightness of the display, thereby leading to precise adjustment of the brightness of display to a brightness at which the user does not feel tired.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device, comprising:
    a housing comprising a front surface and a rear surface facing away from the front surface;
    a display disposed in the housing and being exposed through a portion of the front surface;
    an illuminance sensor disposed between the display and the rear surface, the illuminance sensor overlapping an area of the display when viewed from above the front surface;
    a processor disposed inside the housing and being operatively connected with the display; and
    a memory disposed inside the housing and being operatively connected with the processor,
    wherein the memory stores instructions which, when executed, cause the processor to:
        receive first illuminance data measured using the illuminance sensor while an image is output through the display,
        in response to receiving the first illuminance data, identify display parameter information associated with the image output through the display,
        after identifying the display parameter information, obtain illuminance raw data corresponding to the display parameter information in a state in which light is blocked off from an outside,
        based on the illuminance raw data, obtain correction information associated with the display parameter information, the correction information being obtained by dividing the illuminance raw data by information resulting from reflecting a designated brightness to the display parameter information in the state in which light is blocked off from the outside,
        obtain second illuminance data excluding the correction information from the first illuminance data, and
        adjust a brightness of the display based on the second illuminance data, and
    wherein the display parameter information comprises at least one of color on pixel ratio (COPR) information about the image output through the display or active matrix organic light emitting diode (AMOLED) off ratio (AOR) information about the display.

2. The electronic device of claim 1, wherein the display parameter information further comprises information associated with at least one of a color, the brightness, or a transmittance of the display.

3. The electronic device of claim 1, wherein the illuminance sensor is disposed under the area of the display.

4. The electronic device of claim 1, wherein the instructions, when executed, further cause the processor to:
    measure the first illuminance data at each designated first time interval using the illuminance sensor,
    receive, from the illuminance sensor, the first illuminance data simultaneously measured based on an interrupt occurring at a time of terminating the measuring of the first illuminance data, and
    identify the COPR information about the image output from at least the area of the display.

5. The electronic device of claim 4, wherein the instructions, when executed, further cause the processor to, in response to the interrupt occurring, identify the COPR information about an image frame output from the display.

6. The electronic device of claim 1, wherein the illuminance raw data comprises a red (R) channel sensing value, a green (G) channel sensing value, a blue (B) channel sensing value, and a clear (C) channel sensing value of the illuminance sensor, corresponding to an R value, a G value, a B value, and a C value, respectively, of the image output from the display, with the light blocked off from the outside.

7. The electronic device of claim 1, wherein the illuminance raw data comprises an illuminance value calculated based on at least a part of a red (R) channel sensing value, a green (G) channel sensing value, a blue (B) channel sensing value, and a clear (C) channel sensing value of the illuminance sensor, corresponding to an R value, a G value, a B value, and a C value, respectively, of the image output from the display, with the light blocked off from the outside.

8. An electronic device, comprising:
    a housing comprising a front plate and a rear plate facing away from the front plate;
    a touchscreen display disposed in the housing and comprising at least one pixel, the touchscreen display being configured to be viewed through a portion of the front plate;
    an illuminance sensor disposed between the touchscreen display and the rear plate, the illuminance sensor overlapping the at least one pixel of the touchscreen display when viewed from above the front plate;
    a processor disposed inside the housing and being operatively connected with the touchscreen display and the illuminance sensor; and
    a memory disposed inside the housing and being operatively connected with the processor,
    wherein the memory is configured to store instructions which, when executed, cause the processor to:
        receive, from the illuminance sensor, an amount of light measured by the illuminance sensor during a first time period while an image is output through the touchscreen display,
        in response to receiving the amount of light, calculate a first illuminance value based on at least a part of the amount of light, and identify parameter information related to the at least one pixel of the touchscreen display during the first time period or at a time of termination of the first time period, wherein the parameter information is related to the image output through the touchscreen display,
        after identifying the parameter information, obtain illuminance raw data corresponding to the parameter information in a state in which light is blocked off from an outside,
        based on the illuminance raw data, obtain correction information associated with the parameter information, the correction information being obtained by dividing the illuminance raw data by information resulting from reflecting a designated brightness to the parameter information in the state in which light is blocked off from the outside, obtain a second illuminance value excluding the correction information from the first illuminance value, and adjust a brightness of the touchscreen display based on the second illuminance value, and wherein the parameter information comprises at least one of color on pixel ratio (COPR) information about the image output through the touchscreen display or active matrix organic light emitting diode (AMOLED) off ratio (AOR) information.

9. The electronic device of claim 8, wherein the illuminance sensor is further disposed under at least an area of the touchscreen display.

10. A method of sensing illuminance by an electronic device, the method comprising:

receiving first illuminance data measured using an illuminance sensor while an image is output through a display;

in response to receiving the first illuminance data, identifying display parameter information associated with the first illuminance data, wherein the display parameter information is related to the image output through the display;

after identifying the display parameter information, obtaining illuminance raw data corresponding to the display parameter information in a state in which light is blocked off from an outside;

based on the illuminance raw data, obtaining correction information associated with the display parameter information, the correction information being obtained by dividing the illuminance raw data by information resulting from reflecting a designated brightness to the display parameter information in the state in which light is blocked off from the outside;

obtaining second illuminance data excluding the correction information from the first illuminance data; and adjusting a brightness of the display based on the second illuminance data, wherein the display parameter information comprises at least one of color on pixel ratio (COPR) information about the image output through the display or active matrix organic light emitting diode (AMOLED) off ratio (AOR) information about the display.

11. The method of claim 10, wherein the display parameter information further comprises information associated with at least one of a color, the brightness, or a transmittance of the display.

12. The method of claim 10, further comprising:

receiving an interrupt occurring at a time of termination of an illuminance measurement and illuminance data measured at each designated first time interval from the illuminance sensor;

receiving, from the display, the COPR information per frame; and in response to receiving the interrupt, identifying the COPR information about an image frame output from the display.

13. The method of claim 10, wherein the illuminance raw data comprises a red (R) channel sensing value, a green (G) channel sensing value, a blue (B) channel sensing value, and a clear (C) channel sensing value of the illuminance sensor, corresponding to an R value, a G value, a B value, and a C value, respectively, of an image output from the display, with the light blocked off from the outside or illuminance data calculated based on at least a part of the R channel sensing value, the G channel sensing value, the B channel sensing value, and the C channel sensing value of the illuminance sensor, corresponding to the R value, the G value, the B value, and the C value, respectively, of the image output from the display, with the light blocked off from the outside.

14. A non-transitory storage medium storing instructions, the instructions being configured to be executed by at least one circuit to cause the at least one circuit to perform at least one operation, the at least one operation comprising:

receiving first illuminance data measured using an illuminance sensor while an image is output through a display;

in response to receiving the first illuminance data, identifying display parameter information associated with the first illuminance data, wherein the display parameter information is related to the image output through the display;

after identifying the display parameter information, obtaining illuminance raw data corresponding to the display parameter information in a state in which light is blocked off from an outside;

based on the illuminance raw data, obtaining correction information associated with the display parameter information, the correction information being obtained by dividing the illuminance raw data by information resulting from reflecting a designated brightness to the display parameter information in the state in which light is blocked off from the outside;

obtaining second illuminance data excluding the correction information from the first illuminance data; and adjusting a brightness of the display based on the second illuminance data, wherein the display parameter information comprises at least one of color on pixel ratio (COPR) information about the image output through the display or active matrix organic light emitting diode (AMOLED) off ratio (AOR) information about the display.

15. The electronic device of claim 1, wherein the correction information comprises a COPR coefficient for each of red (R), green (G), and blue (B) values.

* * * * *